United States Patent
Chen et al.

(10) Patent No.: US 10,546,979 B2
(45) Date of Patent: *Jan. 28, 2020

(54) DISPLAY DEVICE AND LIGHTING APPARATUS

(71) Applicant: InnoLux Corporation, Miao-Li County (TW)

(72) Inventors: Jia-Yuan Chen, Miao-Li County (TW); Tsung-Han Tsai, Miao-Li County (TW); Hsiao-Lang Lin, Miao-Li County (TW); Jui-Jen Yueh, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/171,354

(22) Filed: Oct. 25, 2018

(65) Prior Publication Data
US 2019/0067533 A1    Feb. 28, 2019

Related U.S. Application Data

(63) Continuation-in-part of application No. 15/691,765, filed on Aug. 31, 2017.

(60) Provisional application No. 62/512,733, filed on May 31, 2017.

(51) Int. Cl.
*H01L 33/50* (2010.01)
*H01L 33/54* (2010.01)
*H01L 33/48* (2010.01)
*H01L 33/62* (2010.01)

(52) U.S. Cl.
CPC .......... *H01L 33/504* (2013.01); *H01L 33/483* (2013.01); *H01L 33/507* (2013.01); *H01L 33/508* (2013.01); *H01L 33/54* (2013.01); *H01L 33/62* (2013.01)

(58) Field of Classification Search
CPC ..... H01L 33/507; H01L 33/508; H01L 33/54; H01L 33/56; H01L 33/62
See application file for complete search history.

(56) References Cited

U.S. PATENT DOCUMENTS

| | | | |
|---|---|---|---|
| 8,459,832 B2 | 6/2013 | Kim | |
| 2007/0097695 A1* | 5/2007 | Hwang | G02B 5/0226 362/331 |
| 2015/0023026 A1 | 1/2015 | Sakamoto | |
| 2015/0175811 A1 | 6/2015 | Inada | |

(Continued)

*Primary Examiner* — Phat X Cao
(74) *Attorney, Agent, or Firm* — Winston Hsu

(57) ABSTRACT

A display includes a light source, wherein the light source includes a base plate, a light emitting unit, and a light converting component. The light emitting unit is disposed on the base plate and has a first top surface. The light converting component covers the light emitting unit and has a second top surface and plural light converting elements, wherein the first top surface is located between the second top surface and the base plate. The light converting component includes a first region, a second region, and a third region from the first top surface to the second top surface, wherein a first sulfur content of the first region is less than a second sulfur content of the second region, and the first sulfur content of the first region is less than a third sulfur content of the third region.

19 Claims, 16 Drawing Sheets

(56) References Cited

U.S. PATENT DOCUMENTS

| | | |
|---|---|---|
| 2016/0035952 A1 | 2/2016 | Yamada |
| 2016/0072026 A1 | 3/2016 | Kanaumi |
| 2016/0204321 A1 | 7/2016 | Naka |
| 2016/0218252 A1 | 7/2016 | Steckel |
| 2016/0284948 A1 | 9/2016 | Song |
| 2016/0293803 A1 | 10/2016 | Kim |
| 2016/0336492 A1 | 11/2016 | Stott |
| 2017/0033269 A1 | 2/2017 | Yamabe |
| 2017/0062682 A1 | 3/2017 | Inobe |
| 2017/0092823 A1 | 3/2017 | Ukawa |
| 2017/0125650 A1 | 5/2017 | Pickett |

\* cited by examiner

DISPLAY DEVICE AND LIGHTING APPARATUS

CROSS REFERENCE TO RELATED APPLICATIONS

This application is a continuation-in-part of application Ser. No. 15/691,765, filed on Aug. 31, 2017, which claims the benefit of U.S. Provisional Application No. 62/512,733, filed May 31, 2017. This application hereby incorporates entirely by reference the U.S. applications enumerated herein.

BACKGROUND OF THE INVENTION

1. Field of the Invention

The present disclosure relates to a display device and a lighting apparatus, and more particularly, to a display device and a lighting apparatus including a light source with light converting elements disposed therein.

2. Description of the Prior Art

To raise the color saturation of a display device for better image quality, a manufacturer in this field has proposed an approach which applies light converting elements (e.g., quantum dot materials) to a light source. The light converting elements are capable of converting the light emitted from the light emitting devices into white color.

Generally, quantum dot materials mixed with a dispersant are applied as a light conversion layer of the light emitting device (e.g., light emitting diode). The dispersant may include sulfur so as to improve the reliability of the quantum dot materials when they are mixed. However, sulfur may react with some metallic materials (e.g., silver) contained in the light emitting device. Such sulfidation will bring undesired problems, such as discoloration of the metallic materials or variation of electrical characteristics of the metallic materials.

SUMMARY OF THE INVENTION

The present disclosure provides a display device that includes a light source including a base plate, a light emitting unit, and a light converting component. The light emitting unit is disposed on the base plate and has a first top surface and a first bottom surface, and the first bottom surface is adjacent to the base plate and opposite to the first top surface. The light converting component covers the light emitting unit. The light converting component has a second top surface. The first top surface is located between the second top surface and the base plate. The light converting component includes a plurality of light converting elements. A distance between the first top surface and the second top surface in a direction perpendicular to the base plate is defined as h. Above the first top surface, a region of the light converting component from the first top surface to 0.01 h is defined as a first region with a first sulfur content, a region of the light converting component from the 0.01 h to 0.99 h is defined as a second region with a second sulfur content, and a region of the light converting component from the 0.99 h to the second top surface is defined as a third region with a third sulfur content, wherein the first sulfur content is less than the second sulfur content, and the first sulfur content is less than the third sulfur content.

The present disclosure provides a lighting apparatus that includes a light source including a base plate, a light emitting unit, and a light converting component. The light emitting unit is disposed on the base plate and has a first top surface and a first bottom surface, and the first bottom surface is adjacent to the base plate and opposite to the first top surface. The light converting component covers the light emitting unit. The light converting component has a second top surface. The first top surface is located between the second top surface and the base plate. The light converting component includes a plurality of light converting elements. A distance between the first top surface and the second top surface in a direction perpendicular to the base plate is defined as h. Above the first top surface, a region of the light converting component from the first top surface to 0.01 h is defined as a first region with a first sulfur content, a region of the light converting component from the 0.01 h to 0.99 h is defined as a second region with a second sulfur content, and a region of the light converting component from the 0.99 h to the second top surface is defined as a third region with a third sulfur content, wherein the first sulfur content is less than the second sulfur content, and the first sulfur content is less than the third sulfur content.

These and other objectives of the present invention will no doubt become obvious to those of ordinary skill in the art after reading the following detailed description of the preferred embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ".

It will be understood that when an element or layer is referred to as being "on" or "connected to" another element or layer, it may be directly on or directly connected to the other element or layer, or intervening elements or layers may be presented (indirectly). In contrast, when an element is referred to as being "directly on" or "directly connected to" another element or layer, there are no intervening elements or layers presented.

It should be noted that the technical features in different embodiments described in the following may be replaced, recombined, or mixed with one another to constitute another embodiment without departing from the spirit of the present disclosure.

Figure 1A:
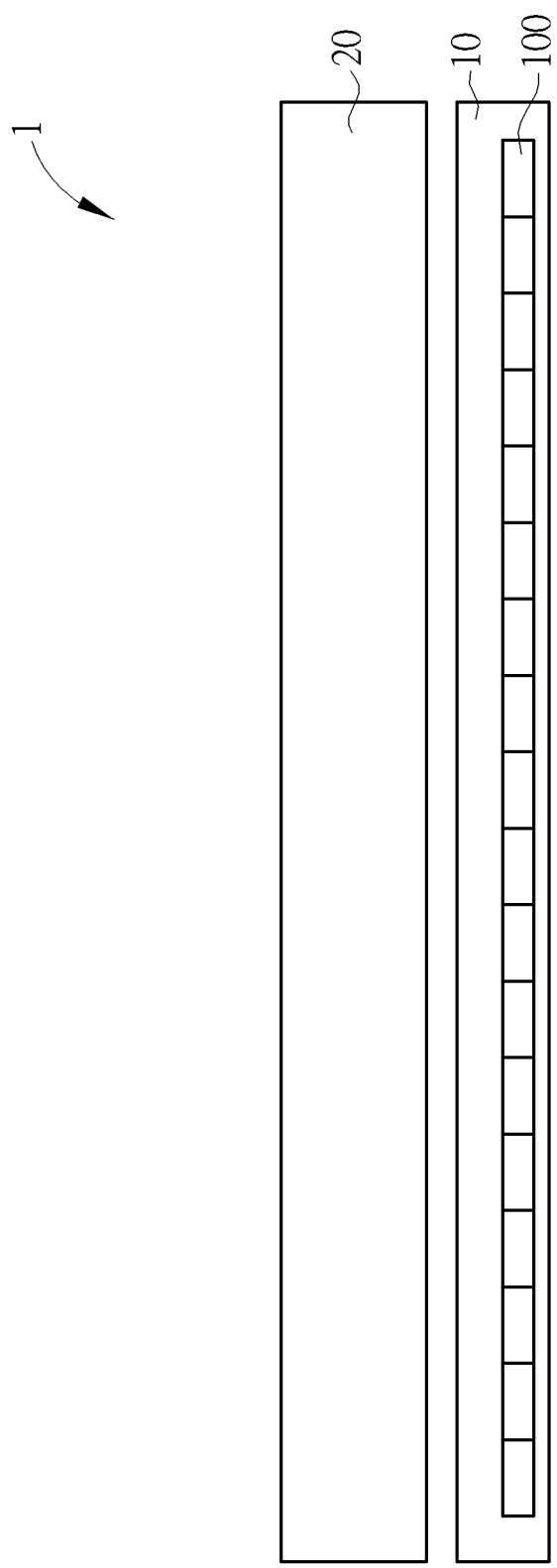
FIG. 1A is a cross-sectional schematic diagram of a display device according to a first type of a first embodiment of the present disclosure.

Referring to FIG. 1A, FIG. 1A is a cross-sectional schematic diagram of a display device according to a first type of a first embodiment of the present disclosure. As shown in FIG. 1A, a display device 1 of this embodiment includes a backlight module 10 and a display panel 20 disposed thereon, but not limited thereto. In this embodiment, the backlight module 10 includes at least one light source 100, and the at least one light source 100 is described in detail in following paragraphs. The at least one light source 100 could be self-emissive inorganic light emitting diode (LED) or self-emissive organic light emitting diode (OLED), a maximum width of the at least one light source 100 could be greater than or equal to 100 mm and less than or equal to 5000 mm, or greater than or equal to 1 mm and less than or equal to 99 mm, or greater than or equal to 0.1 μm and less than or equal to 999 μm. For example, the backlight module 10 shown in FIG. 1A may include one or more light sources 100 shown in FIG. 2. In this embodiment, the light source 100 may be disposed on a bottom surface of the backlight module 10 and emits light toward the display panel 20, namely a direct-illumination type backlight module, but not limited thereto. In another embodiment, the light source 100 may be disposed on a side surface of the backlight module 10 and emits light toward an opposite side surface of the backlight module 10, namely an edge-illumination type backlight module. Additionally, the backlight module 10 may further include a light guide plate for guiding the light from the light source 100 toward the display panel 20, or an optical film for diffusing, focusing, dispersing, refracting, or reflecting, but not limited thereto. In this embodiment, the display panel 20 may be a liquid crystal display panel (LCD), but not limited thereto. The display panel 20 may be any type of display panel generally used in the art for light modulating.

Figure 1B:
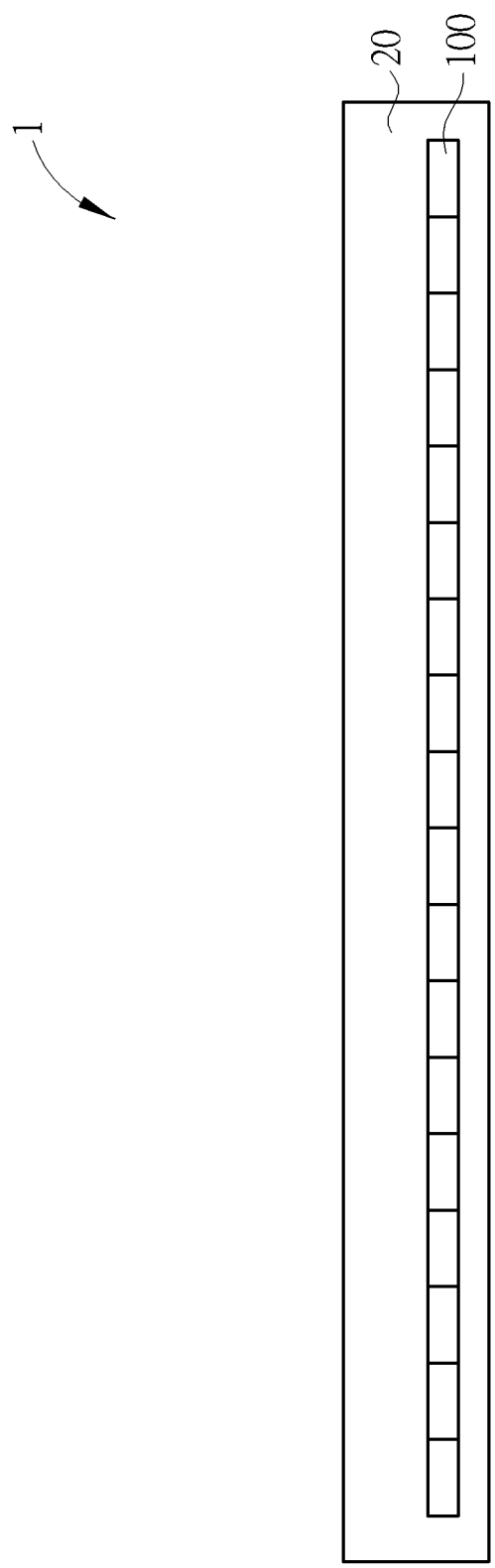
FIG. 1B is a cross-sectional schematic diagram of a display device according to a second type of the first embodiment of the present disclosure.

Referring to FIG. 1B, FIG. 1B is a cross-sectional schematic diagram of a display device according to a second type of the first embodiment of the present disclosure. As shown in FIG. 1B, in a display device 1 of this embodiment, a display panel 20 includes at least one light source 100, and the light source 100 is described in detail in following paragraphs. The at least one light source 100 could be self-emissive inorganic light emitting diode (LED) or self-emissive organic light emitting diode (OLED), a maximum width of the at least one light source 100 could be greater than or equal to 100 mm and less than or equal to 5000 mm, or greater than or equal to 1 mm and less than or equal to 99 mm, or greater than or equal to 0.1 μm and less than or equal to 999 μm. For example, the display panel 20 shown in FIG. 1B may include a plurality of light sources 100 shown in FIG. 2 for displaying image. Additionally, display panel 20 may further include a plurality of transistors and wires for driving the light source 100. In this embodiment, the display panel 20 may be an inorganic light emitting diode display panel (LED), or an organic light emitting diode display panel (OLED), but not limited thereto.

In another embodiments, FIG. 1B could be an electrically device for lighting (lighting apparatus), no active addressing and not a display device for displaying image.

Figure 2:
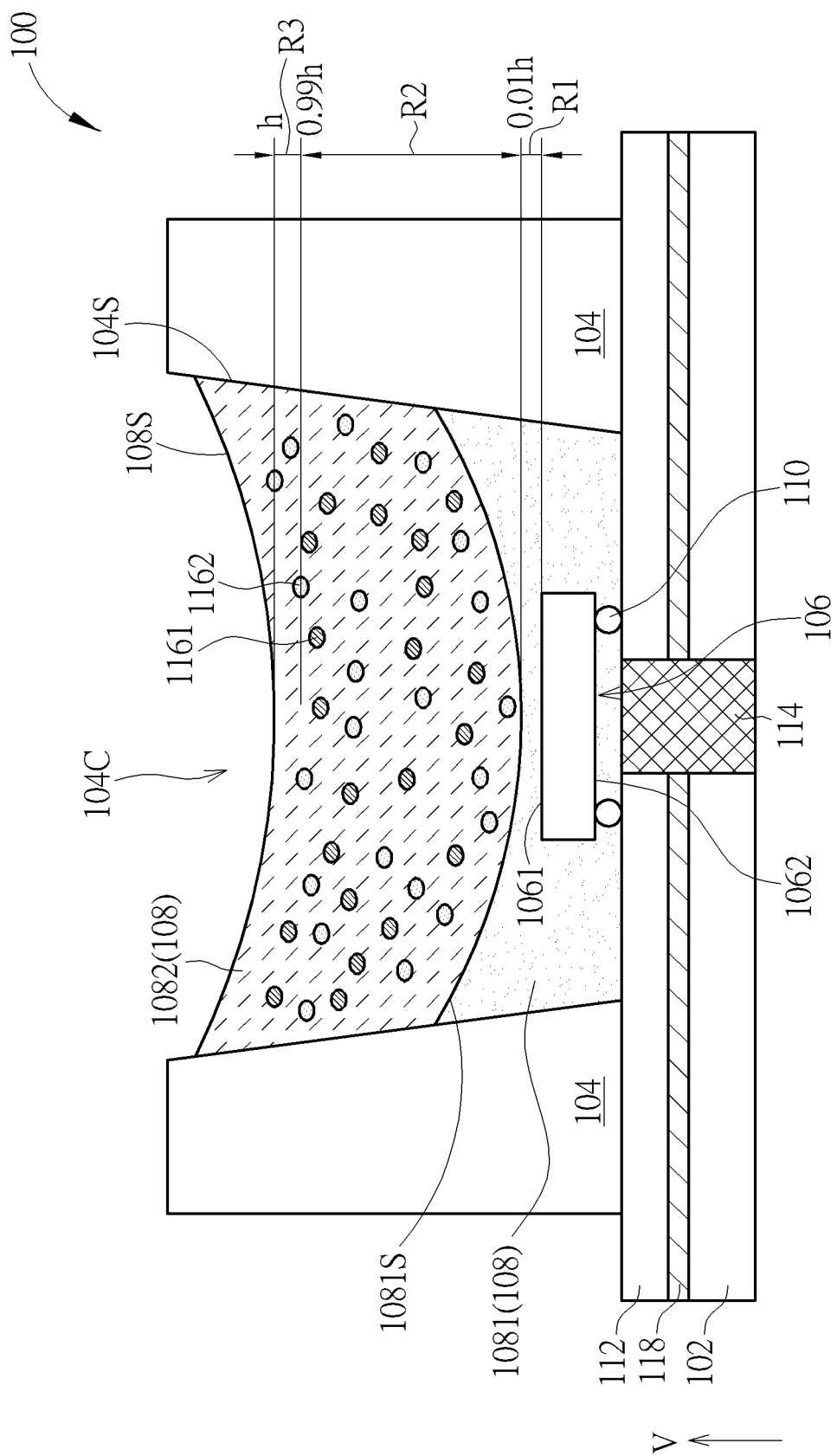
FIG. 2 is a cross-sectional schematic diagram of a light source of the display device according to the first embodiment of the present disclosure.

Referring to FIG. 2, FIG. 2 is a cross-sectional schematic diagram of a light source of the display device according to the first embodiment of the present disclosure. As shown in FIG. 2, the light source 100 of this embodiment includes a base plate 102, a light emitting unit 106, and a light converting component 108, and selectively further includes a frame 104. The base plate 102 may be a rigid plate for supporting and having good heat dissipation, and the material of the base plate 102 may include copper, iron, aluminum, and the like, as well as alloys of such elements. The frame 104 is disposed on the base plate 102 and around the light emitting unit 106, and the frame 104 includes a cavity 104C. The frame 104 may be made of a material that has high stability, such as resin, but not limited thereto. The color of the frame 104 may be white for example. The light emitting unit 106 is disposed on the base plate 102 and correspondingly in the cavity 104C. The light emitting unit 106 could be light emitting diode chip, such as blue LED chip, red LED chip, green LED chip, white LED chip, or other colors of light emitting LED chips. The light emitting unit 106 has a first top surface 1061 and a first bottom surface 1062, the first top surface 1061 faces to the emitting direction of the light emitting unit 106, and the first bottom surface 1062 is adjacent to the base plate 102 and opposite to the first top surface 1061. The light converting component 108 may cover the light emitting unit 106, and at least a portion of the light converting component 108 is disposed in the cavity 104C of the frame 104.

The light emitting unit 106 of this embodiment may be, but not limited to, a flip-chip type light emitting device, wherein two terminals (anode and cathode) of the light emitting unit 106 are located on the bottom surface of the light emitting unit 106 and faces toward the base plate 102. As shown in FIG. 2, two leads 112 are disposed on the base plate 102 and electrically connected to driving circuit (e.g., IC), the two leads are electrically isolated, at least a portion of the two leads are disposed between the base plate 102 and the frame 104. Two bumps 110 may be disposed between the light emitting unit 106 and the base plate 102, and the two terminals (anode and cathode) of the light emitting unit 106 are electrically connected to the two leads through the two bumps respectively. The two terminals (anode and cathode) of the light emitting unit 106 may include conductive materials such as silver, aluminum, copper, gold, indium, titanium, molybdenum or an alloy thereof but not limited thereto. The bumps 110 may include conductive materials such as metal, such as tin, copper, lead, gold, indium, zinc or an alloy thereof, but not limited thereto. The lead 112 may include high conductivity and high reflectivity materials, such as silver, aluminum, copper, gold, indium, titanium, molybdenum or an alloy thereof, but not limited thereto. Therefore, the light emitting unit 106 may be electrically connected to a driving circuit through the leads 112 for example. In this embodiment, one of the lead 112 is electrically connected to a p-type terminal (anode or cathode) of the light emitting unit 106 through the corresponding bump 110, and the other lead 112 is electrically connected to an n-type terminal (cathode or anode) of the light emitting unit 106 through the corresponding bump 110, wherein an passivation layer 114 including an insulation material may further be disposed between two leads 112 to prevent different terminals of the light emitting unit 106 from being electrically connected.

In this embodiment, the light converting component 108 is disposed in the cavity 104C and covers the light emitting unit 106, and therefore the frame 104 surrounds or is located around the light converting component 108 and the light emitting unit 106. The light converting component 108 of this embodiment includes a encapsulation layer 1081 and a light converting layer 1082, wherein the encapsulation layer 1081 is disposed between the light converting layer 1082 and the base plate 102 and covers the first top surface 1061 of the light emitting unit 106, which means the encapsulation layer 1081 is in contact with the first top surface 1061 of the light emitting unit 106. Specifically, the encapsulation layer 1081 covers the light emitting unit 106 entirely. A top surface 1081S of the encapsulation layer 1081 is a concave surface, wherein the top surface 1081S of the encapsulation layer 1081 refers to the surface of the encapsulation layer 1081 at the boundary of the encapsulation layer 1081 and the light converting layer 1082 in this embodiment. The encapsulation layer 1081 fills a lower portion of the cavity 104C, and the encapsulation layer 1081 is in contact with a portion (e.g., lower portion) of a sidewall 104S of the frame 104. The encapsulation layer 1081 of this embodiment includes an organic material or an inorganic material, but not limited thereto. The light converting layer 1082 is disposed on the encapsulation layer 1081 and in contact with the top surface 1081S of the encapsulation layer 1081. The light converting layer 1082 fills an upper portion of the cavity 104C, and the light converting layer 1082 is in contact with the rest portion (e.g., upper portion) of the sidewall 104S of the frame 104. The light converting component 108 includes a plurality of light converting elements. Specifically, the light converting elements are disposed in the light converting layer 1082 in this embodiment, but not in the encapsulation layer 1081. For example, the light converting layer 1082 is made of a mixture of quantum dot materials and sulfur based dispersant. In addition, a sulfur content of the encapsulation layer 1081 is less than a sulfur content of the light converting layer 1082. In this embodiment, the sulfur content of the encapsulation layer 1081 is substantially less than 10 ppm, which means that the sulfur existing in the encapsulation layer 1081 is very few or close to zero or that the sulfur content of the encapsulation layer 1081 may be too low to be measured by the measuring equipment, and therefore the result of the measurement may be zero. For example, the measuring equipment for determining the sulfur content may be EDX (Energy-dispersive X-ray spectrometer), SIMS (secondary-ion mass spectrometer), XPS (X-ray photoelectron spectrometer) or other suitable equipment.

The light converting elements include quantum dot materials, wherein the quantum dot material may be composed of a shell and a core disposed therein, the material of the core may include CdSe, CdS, ZnS, ZnSe, CdTe, CdSeTe, CdZnS, PbSe, AgInZnS, ZnTe, CdSeS, PbS, PbTe, HgS, HgSe, HgTe, GaN, GaP, GaAs, InP, InZnP, InGaP, InGaN, InAs, or ZnO, and the material of the shell may include ZnS, CdS, ZnSe, CdSe, ZnTe, CdTe, PbS, TiO, SrSe, CdO, ZnO, InP, InS, GaP, GaN, GaO, InZnP, InGaP, InGaN, InZnSCdSe, or HgSe, but not limited thereto. In this embodiment, the core of the quantum dot material is CdSe, and the shell of the quantum dot material is ZnS, but not limited thereto. A core size (e.g., a diameter or maximum width of a core) of the quantum dot material of the first light converting elements 1161 is greater than or equal to 2 nanometers and less than or equal to 10 nanometers, wherein the color of the light converted by the quantum dot material varies as the core size of the quantum dot material varies. Additionally, the core size may be measured by a transmission electron microscope (TEM) for example. In this embodiment, the light converting elements include a plurality of first light converting elements 1161 and a plurality of second light converting elements 1162. The first light converting elements 1161 convert the light emitted from the light emitting unit 106 into the first converted light with a first color (first spectrum), the second light converting elements 1162 convert the light emitted from the light emitting unit 106 into the second converted light with a second color (second spectrum), and the first color (first spectrum) is different from the second color (second spectrum).

Specifically, the first color and the second color correspond to two different spectrums. For example, a maximum peak of a spectrum of the light emitted from the light emitting unit 106 corresponds to a wavelength greater than or equal to 400 nanometers and less than or equal to 490 nanometers, which is blue light. A maximum peak of a first spectrum of the first converted light corresponds to a wavelength greater than or equal to 520 nanometers and less than or equal to 530 nanometers, which is green light. Therefore, the first light converting elements 1161 are used for converting blue light into green light, wherein the core size of the quantum dot material of the first light converting element 1161 is greater than or equal to 2 nanometers and less than or equal to 4 nanometers. In addition, a maximum peak of a second spectrum of the second converted light corresponds to a wavelength greater than or equal to 630 nanometers and less than or equal to 640 nanometers, which is red light. Therefore, the second light converting elements 1162 are used for converting blue light into red light, wherein the core size of the quantum dot material of the second light converting element 1162 is greater than or equal to 6 nanometers and less than or equal to 10 nanometers. In this embodiment, the first light converting elements 1161 and the second light converting elements 1162 are mixed in the light converting layer 1082 of the light converting component 108. For example, the light converting layer 1082 may be made of a mixture including the first light converting elements 1161 and the second light converting elements 1162 mixed therein. By this way, the light converting layer 1082 is easy to be produced.

In other embodiments, the light emitting unit 106 may include an UV-light emitting device, such as a UV LED which produce ultraviolet (UV) light for example. Under this circumstance, blue quantum dot material(s) or particles may be additionally disposed in the light converting layer 1082, so as to convert the UV light into blue light.

In this embodiment, the light converting component 108 has a second top surface 108S, the first top surface 1061 is located between the second top surface 108S and the base plate 102. The second top surface 108S is also the top surface of the light converting component 108. The second top surface 108S is a concave surface in this embodiment. A distance between the first top surface 1061 of the light emitting unit 106 and the second top surface 108S of the light converting component 108 in a direction V perpendicular to the base plate 102 is defined as h. The first top surface 1061 represents the highest level among all the components included in the light emitting unit 106, such as a top surface of the LED chip shown in FIG. 2. The distance h may be calculated from the first top surface 1061 to the second top surface 108S within a projection of the first top surface 1061 of the light emitting unit 106 along the direction V for example. Above the first top surface 1061, a region of the light converting component 108 from the first top surface 1061 to 0.01 h is defined as a first region R1 with a first sulfur content, a region of the light converting component 108 from the 0.01 h to 0.99 h is defined as a second region R2 with a second sulfur content, and a region of the light converting component 108 from the 0.99 h to the second top surface 108S is defined as a third region R3 with a third sulfur content. Specifically, the level of 0.01 h is a boundary between the first region R1 and the second region R2, wherein the level of 0.01 h is included in the first region R1 but excluded from the second region R2. Similarly, the level of 0.99 h is a boundary between the second region R2 and the third region R3, wherein the level of 0.99 h is included in the second region R2 but excluded from the third region R3. The first sulfur content is less than the second sulfur content, and the first sulfur content is less than the third sulfur content. In addition, the second sulfur content is less than the third sulfur content. Atomic percentage of sulfur is defined as sulfur content. The first sulfur content to the second sulfur content is defined as a first ratio (first ratio=first sulfur content/second sulfur content), the first sulfur content to the third sulfur content is defined as a second ratio (second ratio=first sulfur content/third sulfur content), the first ratio is greater than or equal to 0 and less than or equal to 0.75, and the second ratio is greater than or equal to 0 and less than or equal to 0.75. In short, the first region R1 is the region closest to the light emitting unit 106, and the first sulfur content may be very low or may even be zero (depend on measurement limitation). Accordingly, the drawbacks brought by sulfidation of some metallic materials contained in the light emitting unit 106 or in the other portion of the light source 100 that are easily reacted with sulfur (e.g., discoloration of silver or rise of resistivity of the light emitting unit 106) may be avoided effectively. Additionally, since the encapsulation layer 1081 covers a portion of the leads 112, the reaction between the leads 112 and sulfur may be avoided.

Figure 3:
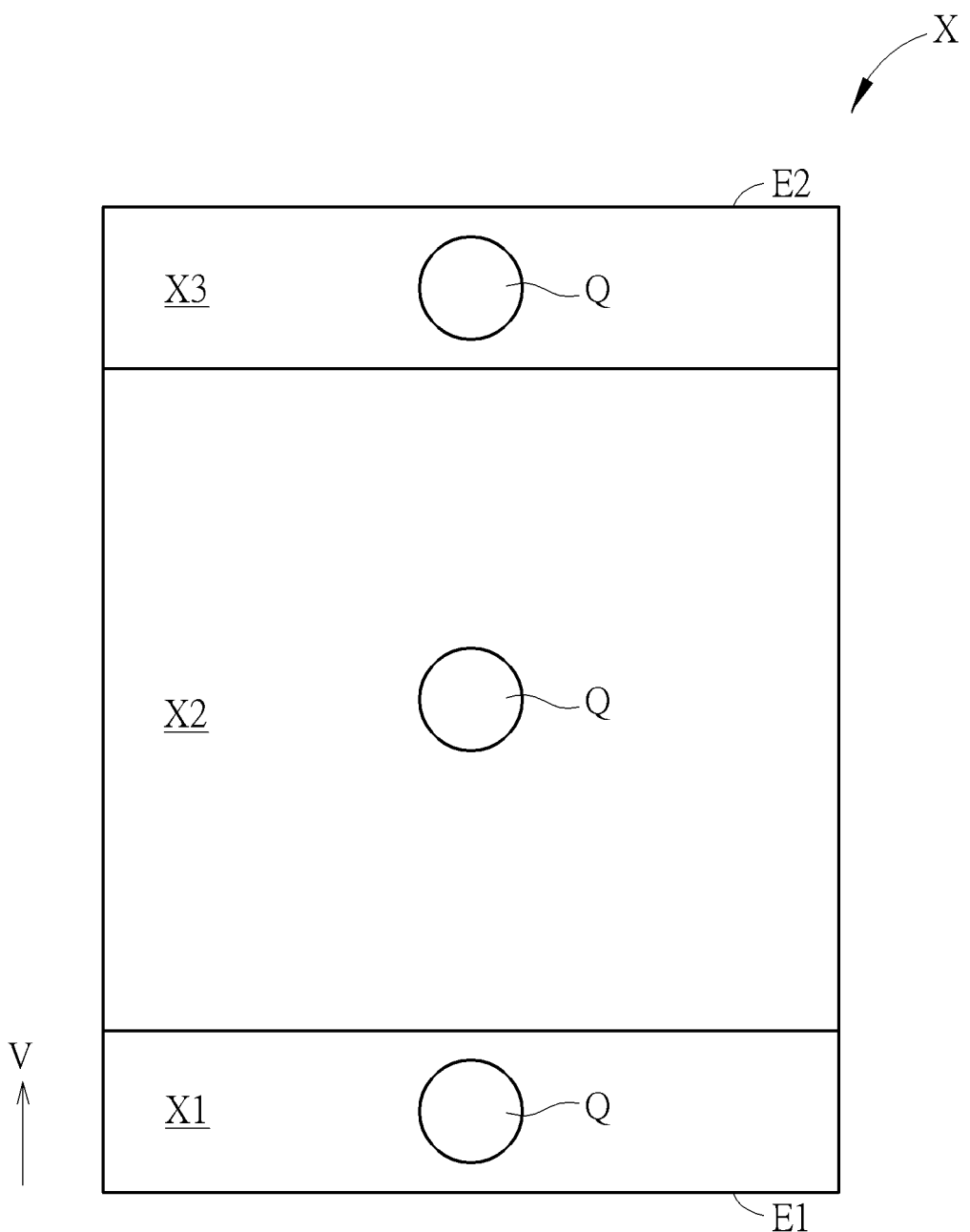
FIG. 3 is a schematic diagram illustrating a method for measuring the sulfur content according to the first embodiment of the present disclosure.

A method of measuring the first sulfur content, the second sulfur content, and the third sulfur content is described herein in detail. The distance h is greater than or equal to 30 micrometers and less than or equal to 50 micrometers, but not limited thereto. In this embodiment, the distance h is about 30 micrometers for example. The sulfur content may be measured by suitable measuring equipment described above. Referring to FIG. 3, FIG. 3 is a schematic diagram illustrating a method for measuring the sulfur content according to the first embodiment of the present disclosure. As shown in FIG. 3, a block X represents a sampling area in the first region R1, the second region R2, or the third region R3 above the first top surface 1061. For example, when the block X represents the sampling area in the first region R1, a bottom edge E1 of the block X indicates the first top surface 1061 of the light emitting unit 106 where the height is 0 h, and a top edge E2 of the block X indicates a level that is 0.01 h (about 0.3 micrometers for example) from the first top surface 1061 of the light emitting unit 106. When the block X represents the sampling area in the second region R2, the bottom edge E1 of the block X indicates the level that is 0.01 h from the first top surface 1061 of the light emitting unit 106, and the top edge E2 of the block X indicates the level that is 0.99 h (about 29.7 micrometers for example) from the first top surface 1061 of the light emitting unit 106. When the block X represents the sampling area in the third region R3, the bottom edge E1 of the block X indicates the level that is 0.99 h from the first top surface 1061 of the light emitting unit 106, and the top edge E2 of the block X indicates the second top surface 108S (where h is about 30 micrometers for example). In addition, the block X is divided into a first sub-region X1, a second sub-region X2, and a third sub-region X3 from the bottom to the top in the direction V which is perpendicular to the base plate 102. The first sub-region X1 extends about 30 nanometers upward from the bottom edge E1, the third sub-region X3 extends about 30 nanometers downward from the top edge E2, and the rest portion of the block X between the first sub-region X1 and the third sub-region X3 is the second sub-region X2. In addition, three measurement points Q are located in the first sub-region X1, the second sub-region X2, and the third sub-region X3 respectively. The measurement point Q may be located at the center of each sub-region, but not limited thereto. In other words, there are three measurement points Q disposed in each region (the first region R1, the second region R2, or the third region R3) for measuring the sulfur content, wherein two of the measurement points Q are respectively disposed within regions that are about 30 nanometers from the bottom edge E1 and the top edge E2. The sulfur content in each region may be obtained by averaging three values that are measured by three measurement points Q located therein. In other embodiments, the number of the measurement points Q may also be more than three.

In this embodiment, the shell of the quantum dot material is ZnS, and therefore the light converting component 108 contains zinc. The conversion efficiency and light uniformity may be improved when the light converting component 108 includes high zinc content. Specifically, zinc is included in the light converting layer 1082 of the light converting component 108. In the light converting component 108, the first region R1 has a first zinc content, the second region R2 has a second zinc content, and the third region R3 has a third zinc content. Atomic percentage of zinc is defined as zinc content. The first zinc content is less than the second zinc content, and the first zinc content is less than the third zinc content. Additionally, the second zinc content is less than the third zinc content. The method of measuring the sulfur content described above may also apply to the measurement of zinc content.

As shown in FIG. 2, the light source 100 of this embodiment may include a first protection layer 118 disposed between the base plate 102 and the light converting component 108 and below the leads 112. The first protection layer 118 may be made of a material that is hardly reacted with sulfur. For example, the material of the first protection layer 118 includes gold, palladium, or alloys of such elements, but not limited thereto. Among the materials listed above, gold may provide better stability. The first protection layer 118 may isolate the light emitting unit 106 or the leads 112 from being reacted with sulfur in the environment. In addition, the passivation layer 114 is also disposed in the first protection layer 118 to prevent different terminals of the light emitting unit 106 from being electrically connected.

The following description will detail the different embodiments or variant embodiments of the present disclosure. To simplify the description, identical components in each of the following embodiments or variant embodiments are marked with identical symbols. For making it easier to understand the differences between the embodiments, the following description will detail the dissimilarities among different embodiments and the identical technical features will not be redundantly described.

Figure 4A:
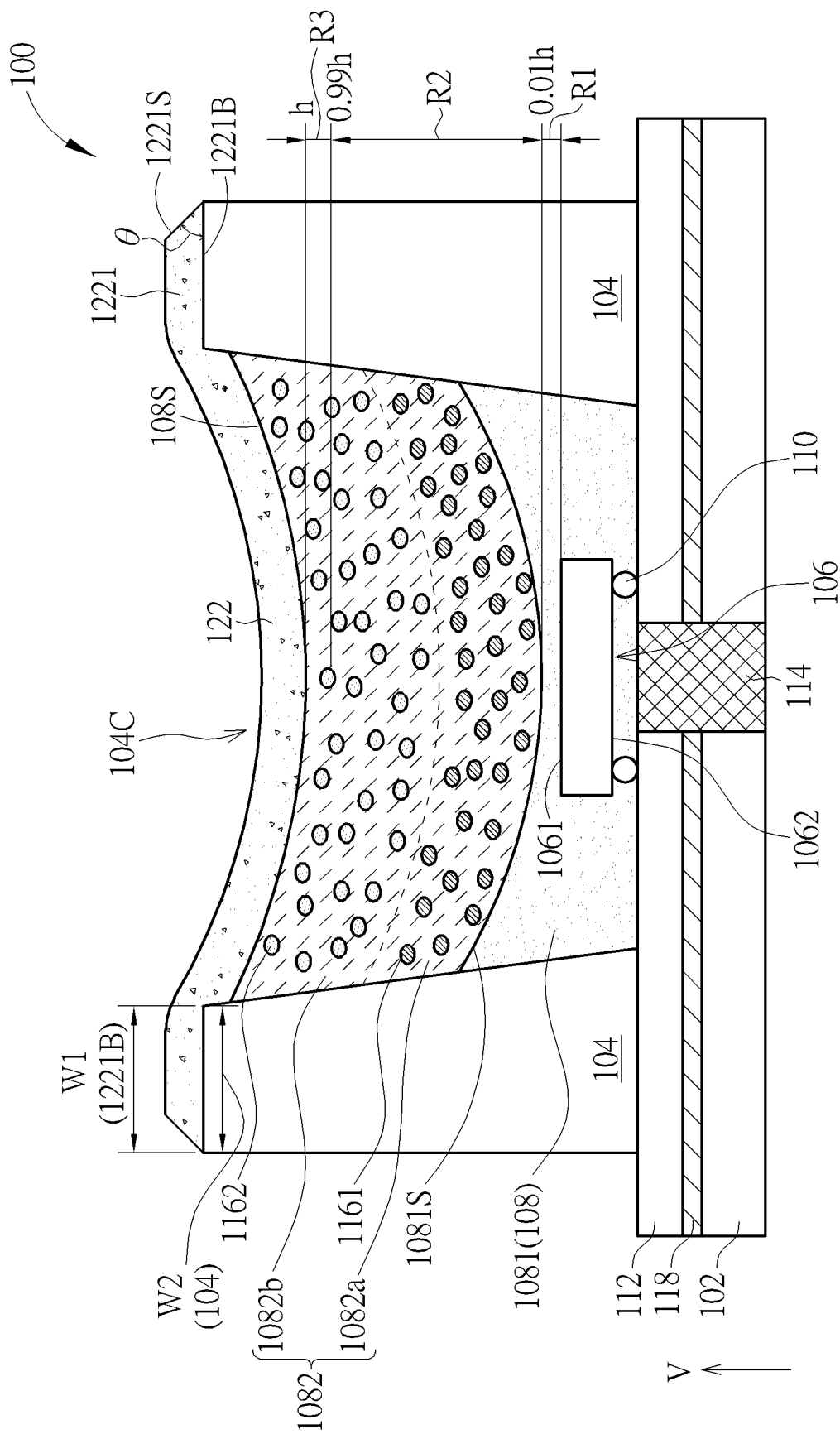
FIG. 4A is a cross-sectional schematic diagram of a light source of a display device according to a second embodiment of the present disclosure.

Referring to FIG. 4A, FIG. 4A is a cross-sectional schematic diagram of a light source of a display device according to a second embodiment of the present disclosure. As shown in FIG. 4A, the light emitting unit 106 of this embodiment may be a flip-chip type light emitting device, the light emitting unit 106 is connected to two leads 112 through two bumps 110 respectively. In addition, the first light converting elements 1161 is disposed between the second light converting elements 1162 and the light emitting unit 106 which means that part of the first light converting elements 1161 is disposed more closer to the light emitting unit 106 than part of the second light converting elements 1162, and the first light converting elements 1161 and the second light converting elements 1162 are not mixed together. For example, the light converting layer 1082 may include a layer 1082a having the first light converting elements 1161 and a layer 1082b having the second light converting elements 1162, wherein the layer 1082a and the layer 1082b may be filled sequentially, such that the color gamut of the light source 100 is easy controlled according this fabrication process. Specifically, the layer 1082a is filled in the cavity 104C and formed on the encapsulation layer 1081 first, and the layer 1082b is filled in the cavity 104C and formed on the layer 1082a next, but not limited thereto. In other embodiments, the layer 1082b may be formed first and the layer 1082a may be formed later, so that the second light converting elements 1162 is disposed between the first light converting elements 1161 and the light emitting unit 106. In other embodiment, the first light converting elements 1161 and the second light converting elements 1162 are mixed together, and the layer 1082a and the layer 1082b may be mixed together.

In this embodiment, the light source 100 further includes a second protection layer 122, and the light converting component 108 is disposed between the second protection layer 122 and the base plate 102. The second protection layer 122 includes an extending part 1221 disposed on the frame 104, the extending part 1221 includes a bottom surface 1221B adjoining to the frame 104 and a side surface 1221S connected to the bottom surface 1221B, wherein the side surface 1221S and the bottom surface 1221B include an acute angle θ. The acute angle θ is greater than or equal to 5 degrees and less than or equal to 90 degrees. The second protection layer 122 may include an oxide film or a nitride film, but not limited thereto. The material of the oxide film may include Al2O3, SiO2, or TiO2, but not limited thereto. The material of the nitride film may include SiNx, AlN, TiN, or ZrN, but not limited thereto. The second protection layer 122 may reduce the light converting component 108 or the light emitting unit 106 disposed therein being affected by oxygen or moisture in the environment. In addition, the extending part 1221 of the second protection layer 122 extends on the frame 104 may provide better sealability, so as to prevent the light converting component 108 or the light emitting unit 106 disposed therein from being affected by oxygen or moisture more effectively. For example, the bottom surface 1221B includes a first width W1, a top surface of the frame 104 includes a second width W2, and W1≥1/10W2. In this embodiment, the range of the first width W1 may be 2/3W2≤W1≤W2 for good sealability and being economical as well. In addition, a top surface of the second protection layer 122 in the cavity 104C is a concave surface in this embodiment, but not limited thereto. In other embodiments, the top surface of the second protection layer 122 in the cavity 104C may be a convex surface.

Figure 4B:
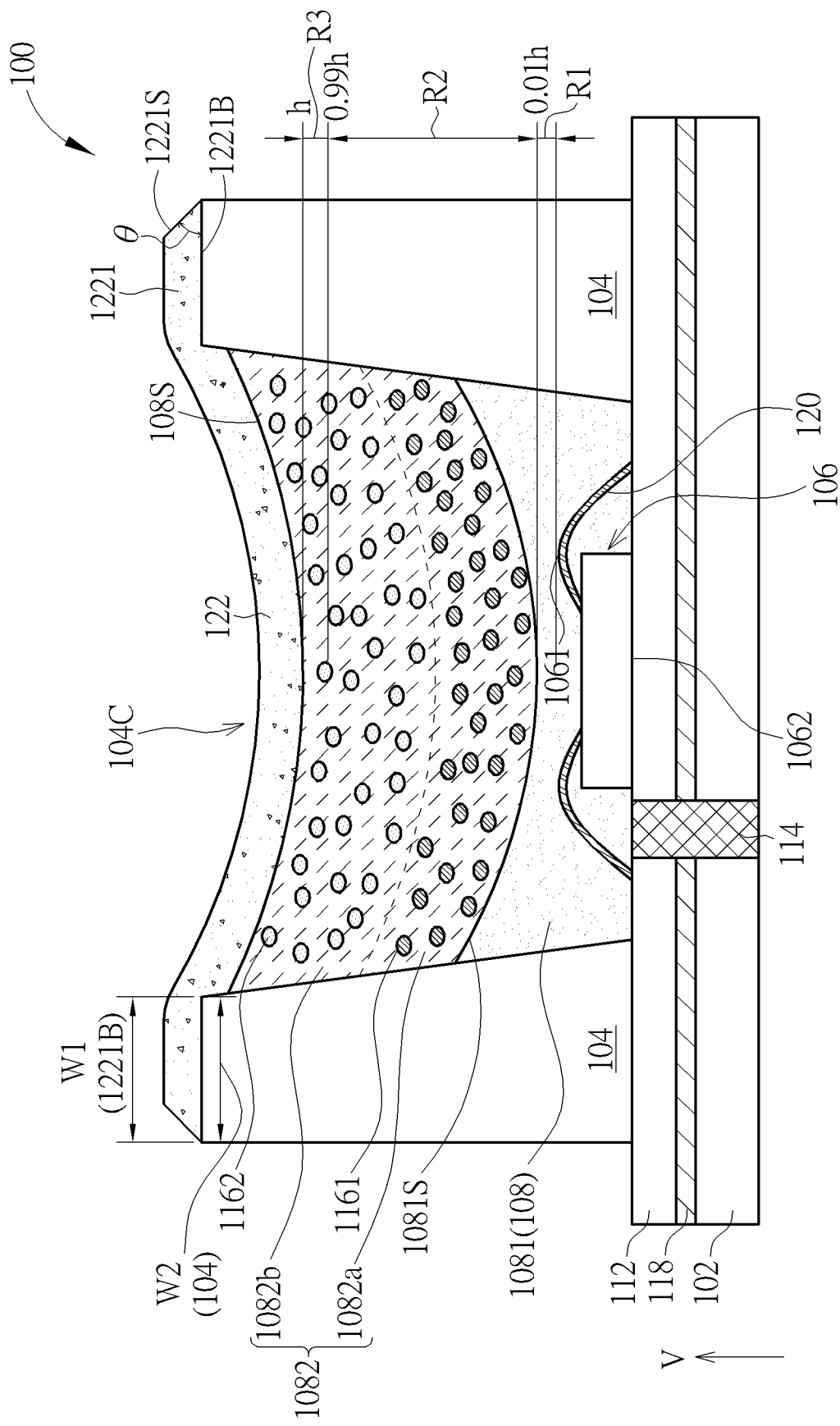
FIG. 4B is a cross-sectional schematic diagram of a light source of a display device according to another type of the second embodiment of the present disclosure.

Referring to FIG. 4B, FIG. 4B is a cross-sectional schematic diagram of a light source of a display device according to another type of the second embodiment of the present disclosure. As shown in FIG. 4, the light emitting unit 106 of this embodiment may be a wire-bonding type light emitting device, which includes two conductive wires 120. In detail, the light emitting unit 106 is disposed on the base plate 102 and adjacent to the passivation layer 114, and two terminals (e.g., p-type and n-type terminals) of the light emitting unit 106 are respectively electrically connected to two leads 112 through the conductive wires 120. One of the two conductive wires cross the passivation layer 114 within a projection along the direction V. The conductive wires 120 may include silver wires, but not limited thereto. It is noteworthy that the first top surface 1061 of the light emitting unit 106 in this embodiment is a surface at the level of the highest peak of the conductive wires 120, which is at the top of the conductive wires 120. Accordingly, the encapsulation layer 1081 directly and completely covers the conductive wires 120 of the light emitting unit 106. In addition, the first light converting elements 1161 is disposed between the second light converting elements 1162 and the light emitting unit 106, and the first light converting elements 1161 and the second light converting elements 1162 are not mixed together. For example, the light converting layer 1082 may include a layer 1082a having the first light converting elements 1161 and a layer 1082b having the second light converting elements 1162, wherein the layer 1082a and the layer 1082b may be filled sequentially, such that the color gamut of the light source 100 is easy controlled according this fabrication process. Specifically, the layer 1082a is filled in the cavity 104C and formed on the encapsulation layer 1081 first, and the layer 1082b is filled in the cavity 104C and formed on the layer 1082a next, but not limited thereto. In other embodiments, the layer 1082b may be formed first and the layer 1082a may be formed later, so that the second light converting elements 1162 is disposed between the first light converting elements 1161 and the light emitting unit 106. In other embodiment, the first light converting elements 1161 and the second light converting elements 1162 are mixed together, and the layer 1082a and the layer 1082b may be mixed together.

In this embodiment, the light source 100 includes a second protection layer 122, and the light converting component 108 is disposed between the second protection layer 122 and the base plate 102. The second protection layer 122 includes an extending part 1221 disposed on the frame 104, the extending part 1221 includes a bottom surface 1221B adjoining to the frame 104 and a side surface 1221S connected to the bottom surface 1221B, wherein the side surface 1221S and the bottom surface 1221B include an acute angle θ. The acute angle θ is greater than or equal to 5 degrees and less than or equal to 90 degrees. The second protection layer 122 may include an oxide film or a nitride film, but not limited thereto. The material of the oxide film may include Al2O3, SiO2, or TiO2, but not limited thereto. The material of the nitride film may include SiNx, AlN, TiN, or ZrN, but not limited thereto. The second protection layer 122 may reduce the light converting component 108 or the light emitting unit 106 disposed therein being affected by oxygen or moisture in the environment. In addition, the extending part 1221 of the second protection layer 122 extends on the frame 104 may provide better sealability, so as to prevent the light converting component 108 or the light emitting unit 106 disposed therein from being affected by oxygen or moisture more effectively. For example, the bottom surface 1221B includes a first width W1, a top surface of the frame 104 includes a second width W2, and W1≥⅒W2. In this embodiment, the range of the first width W1 may be ⅔W2≤W1≤W2 for good sealability and being economical as well. In addition, a top surface of the second protection layer 122 in the cavity 104C is a concave surface in this embodiment, but not limited thereto. In other embodiments, the top surface of the second protection layer 122 in the cavity 104C may be a convex surface.

Figure 5:
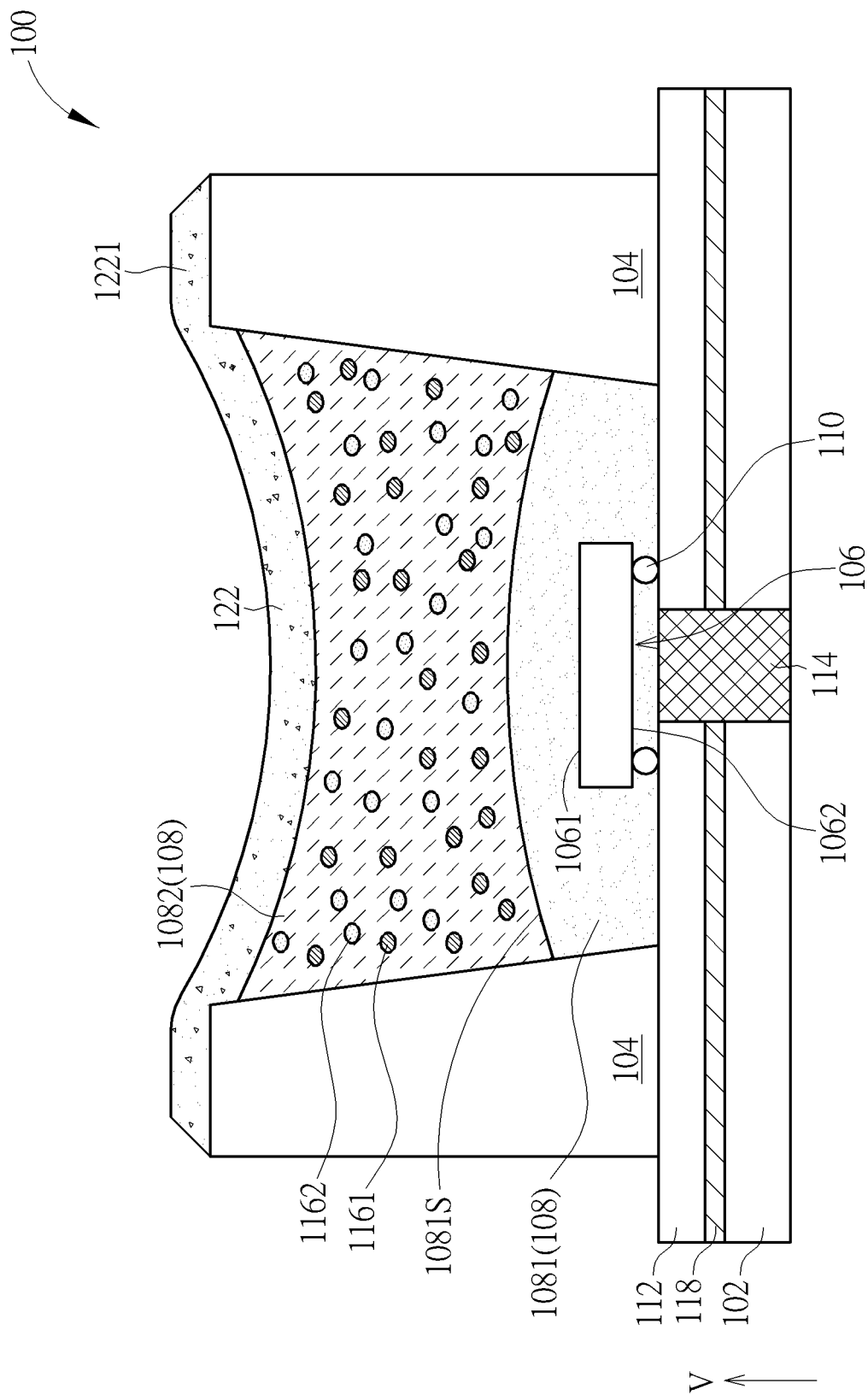
FIG. 5 is a cross-sectional schematic diagram of a light source of a display device according to a third embodiment of the present disclosure.

Referring to FIG. 5, FIG. 5 is a cross-sectional schematic diagram of a light source of a display device according to a third embodiment of the present disclosure. As shown in FIG. 5, the light emitting unit 106 of this embodiment is a flip-chip type light emitting device. The main difference between this embodiment and the second embodiment is that the top surface 1081S of the encapsulation layer 1081 above the light emitting unit 106 is a convex surface. The light emitted from the light emitting unit 106 may be centralized within the first top surface 1061, and the light may diverge while passing through the convex top surface 1081S of this embodiment. Therefore, the light may be uniformly converted by the light converting elements, and the converted light may also have more uniform distribution.

Figure 6:
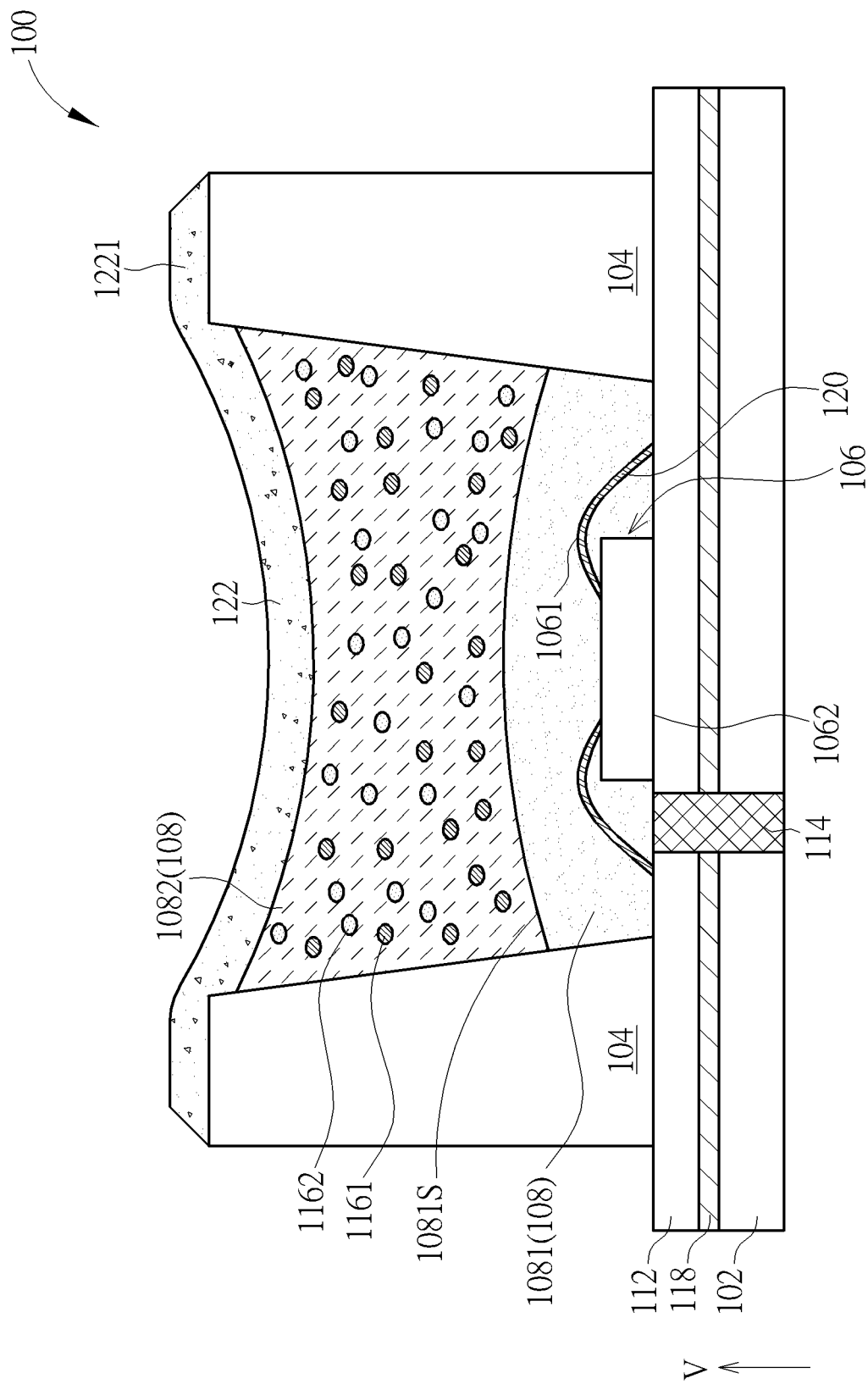
FIG. 6 is a cross-sectional schematic diagram of a light source of a display device according to a fourth embodiment of the present disclosure.

Referring to FIG. 6, FIG. 6 is a cross-sectional schematic diagram of a light source of a display device according to a fourth embodiment of the present disclosure. As shown in FIG. 6, the light emitting unit 106 of this embodiment is a wire-bonding type light emitting device as described in the second embodiment, and the top surface 1081S of the encapsulation layer 1081 above the light emitting unit 106 is a convex surface as described in the third embodiment.

Figure 7:
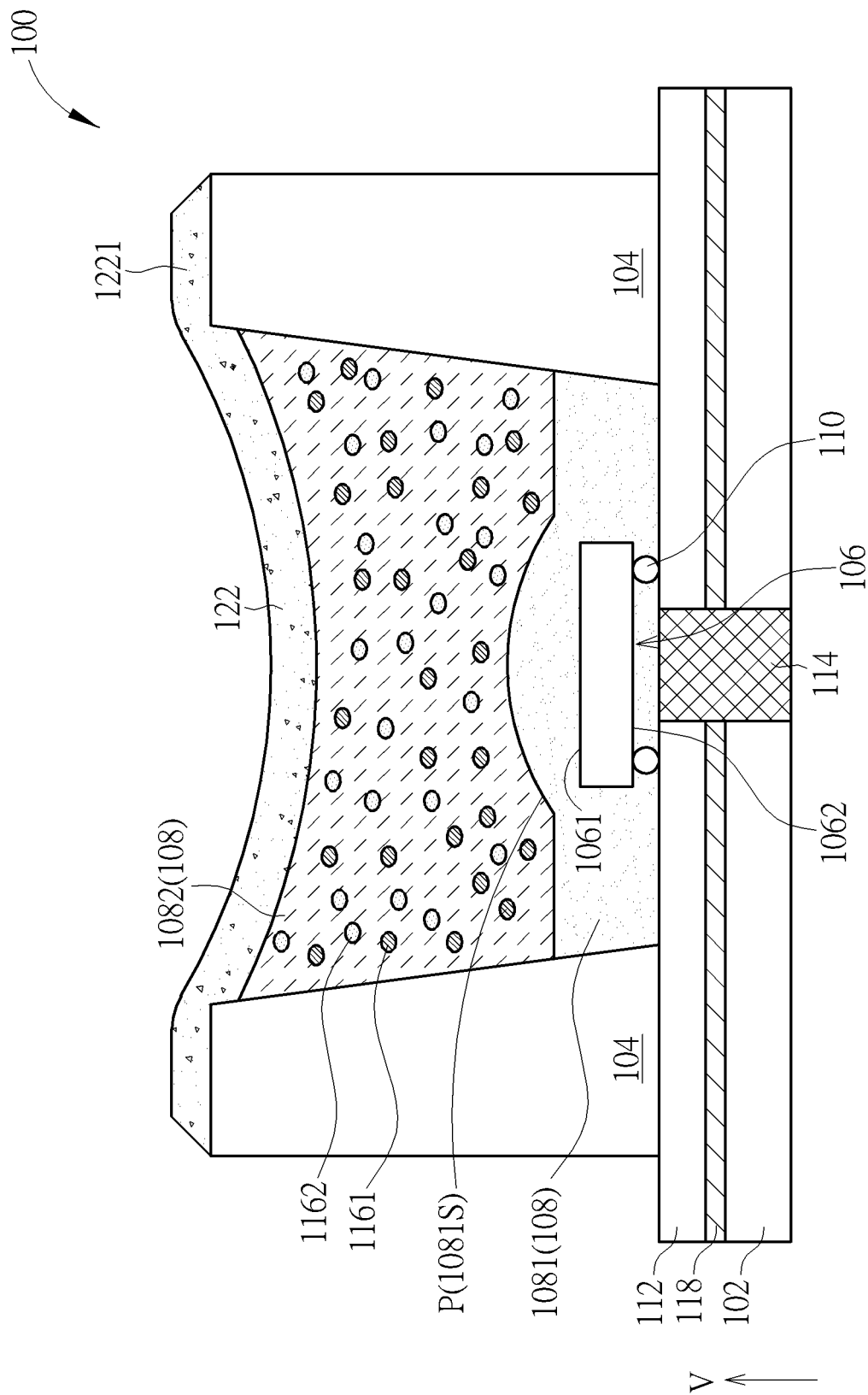
FIG. 7 is a cross-sectional schematic diagram of a light source of a display device according to a fifth embodiment of the present disclosure.

Referring to FIG. 7, FIG. 7 is a cross-sectional schematic diagram of a light source of a display device according to a fifth embodiment of the present disclosure. As shown in FIG. 7, the light emitting unit 106 of this embodiment is a flip-chip type light emitting device. A difference between this embodiment and the third embodiment is that a portion P of the top surface 1081S of the encapsulation layer 1081 directly above the light emitting unit 106 is a convex surface, and the rest portion of the top surface 1081S that does not cover the light emitting unit 106 is a flat surface.

Figure 8:
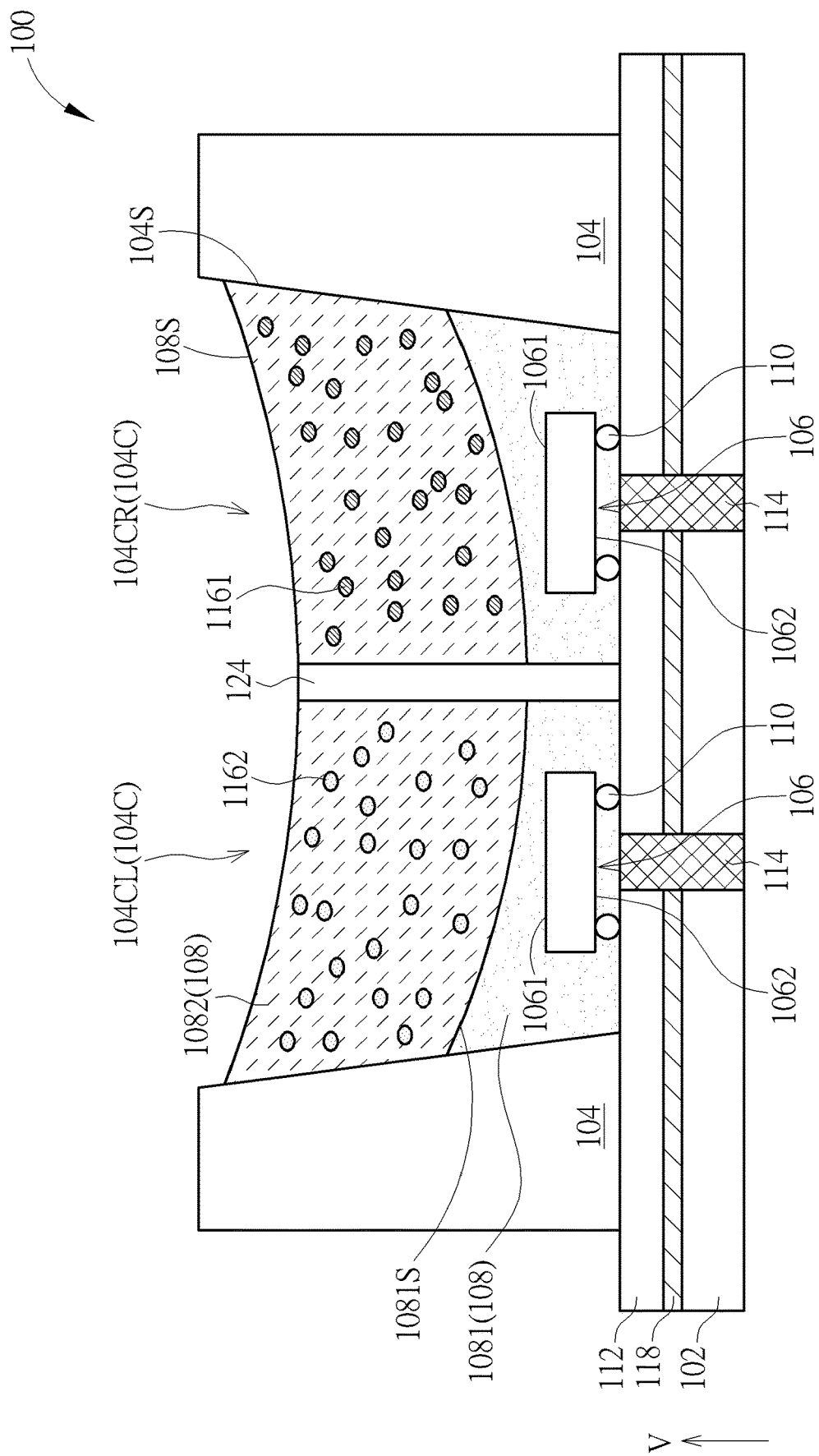
FIG. 8 is a cross-sectional schematic diagram of a light source of a display device according to a sixth embodiment of the present disclosure.

Referring to FIG. 8, FIG. 8 is a cross-sectional schematic diagram of a light source of a display device according to a sixth embodiment of the present disclosure. In the light source 100 of this embodiment, two LED chips are included in one light source 100. As shown in FIG. 8, the light source 100 includes a plurality of light emitting units 106 and a plurality of light converting components 108. The frame 104 includes a plurality of cavities 104C, and the adjoining cavities 104C are separated by a partition wall 124. One of the light emitting units 106 is covered by one of the corresponding light converting components 108 and is disposed in one of the cavities 104C. The second top surfaces 108S of the light converting components 108 in the adjoining cavities 104C together form a curve in the cross-sectional view, wherein the curve is a concave curve in this embodiment, but the curve may also be a convex curve in other embodiments. Similarly, the top surfaces 1081S of the first light converting components 1081 in the adjoining cavities 104C together form a curve in the cross-sectional view, wherein the curve is a concave curve in this embodiment, but the curve may also be a convex curve in other embodiments. In addition, the light converting elements 106 in the light converting component 108 in one of the cavities 104C convert the light emitted from the corresponding light emitting unit 106 into the converted light with a color. Further, the converted light produced in one of the cavities 104C has a color different from the color of the converted light produced in another one of the cavities 104C. For example, the frame 104 shown in FIG. 8 has two cavities 104C, wherein an light converting component 108 in a cavity 104CR at the right hand side includes the first light converting elements 1161 only, and an light converting component 108 in a cavity 104CL at the left hand side includes the second light converting elements 1162 only. Therefore, the light converting component 108 in the cavity 104CR may convert blue light into green light, and the light converting component 108 in the cavity 104CL may convert blue light into red light. Also, white light may be obtained by mixing green light from the cavity 104CR, red light from the cavity 104CL, and a portion of blue light that is not converted by the light converting elements.

Figure 9:
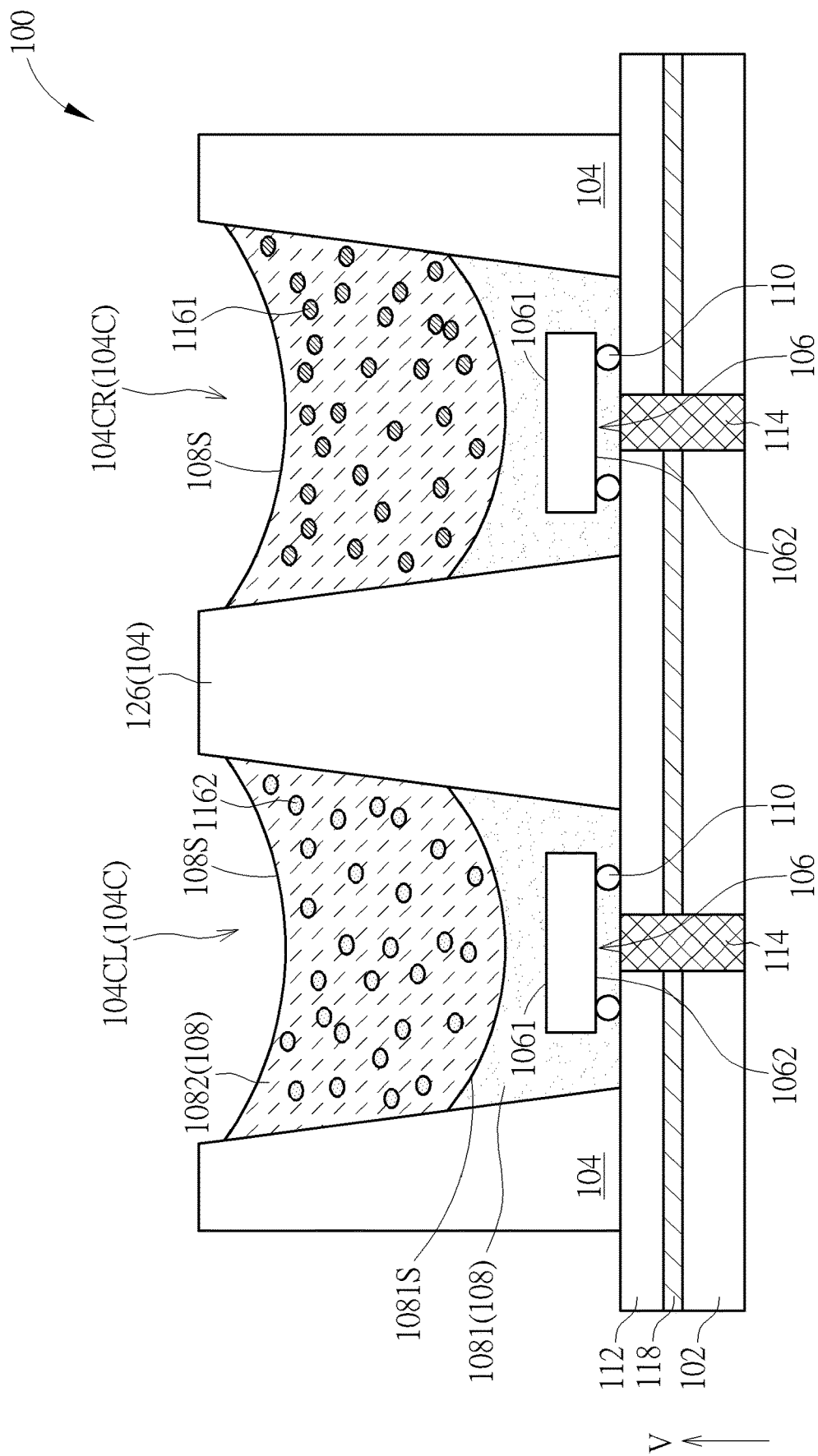
FIG. 9 is a cross-sectional schematic diagram of a light source of a display device according to a seventh embodiment of the present disclosure.

Referring to FIG. 9, FIG. 9 is a cross-sectional schematic diagram of a light source of a display device according to a seventh embodiment of the present disclosure. The light source 100 of this embodiment includes two LED chips. The main difference between this embodiment and the sixth embodiment is that the adjoining cavities 104C (e.g., the cavity 104CL and the cavity 104CR in FIG. 9) are separated by a bank 126 of the frame 104, wherein the bank 126 may be a portion of the frame 104. As shown in FIG. 9, the second top surfaces 108S in the cavity 104CL and the cavity 104CR are independent curves in the cross-sectional view respectively, wherein the curves are both concave curves in this embodiment, but not limited thereto. In another embodiment, the curves may be both convex curves. In other embodiments, one of the curves may be a concave curve, and the other curve may be a convex curve. Similarly, the top surfaces 1081S of the first light converting components 1081 in the cavity 104CL and the cavity 104CR are curves in the cross-sectional view respectively, wherein the curves are both concave curves in this embodiment, but not limited thereto.

Figure 10:
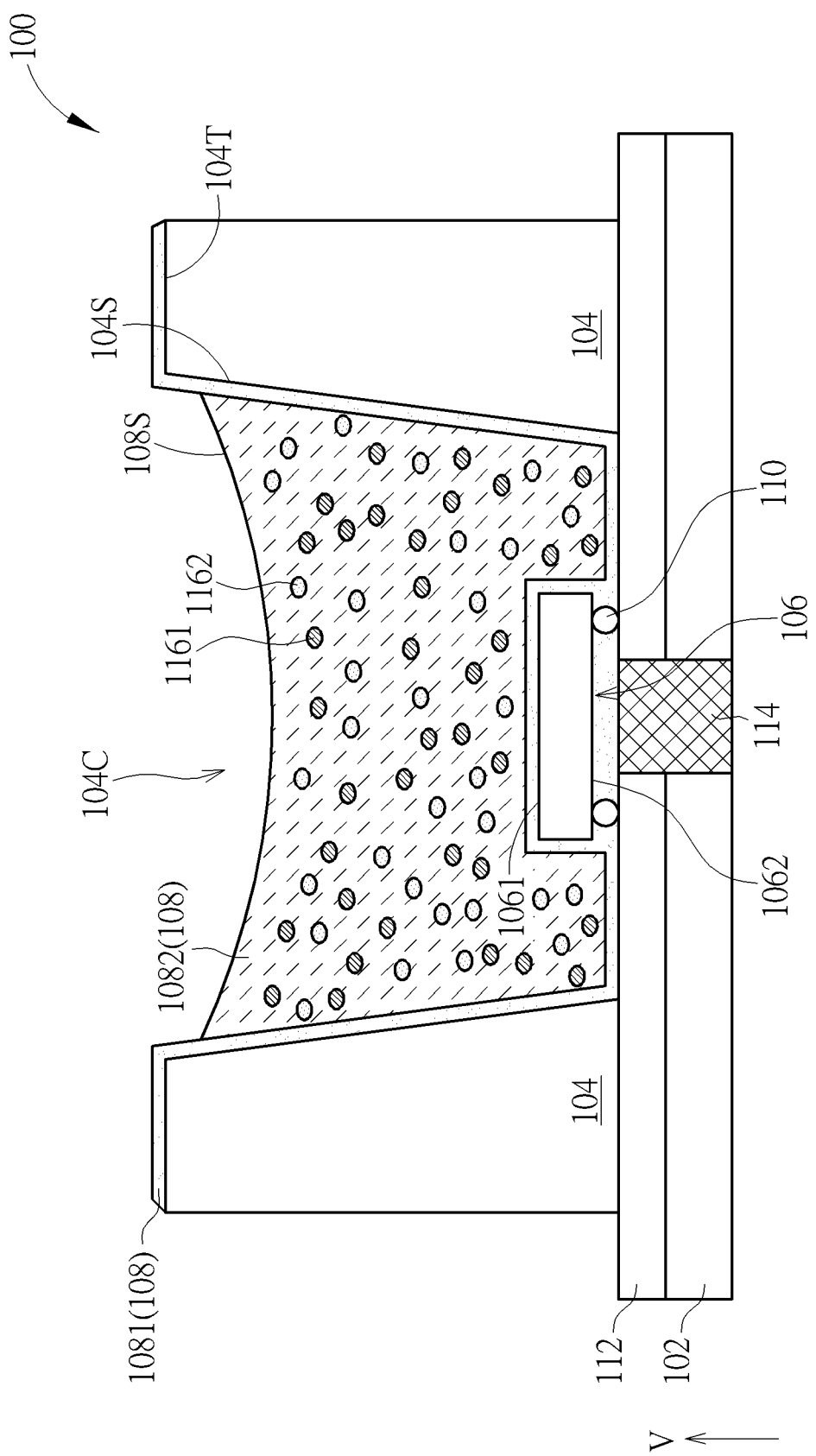
FIG. 10 is a cross-sectional schematic diagram of a light source of a display device according to an eighth embodiment of the present disclosure.

Referring to FIG. 10, FIG. 10 is a cross-sectional schematic diagram of a light source of a display device according to an eighth embodiment of the present disclosure. One of the differences between this embodiment and the first embodiment is that the encapsulation layer 1081 of this embodiment includes an inorganic material, wherein the encapsulation layer 1081 may be formed conformally on the base plate 102 and the light emitting unit 106 by a coating process or a deposition process, such as atomic layer deposition (ALD), chemical vapor deposition (CVD), or physical vapor deposition (PVD). As shown in FIG. 10, the encapsulation layer 1081 formed by the methods described above covers the light emitting units 106, a portion of the leads 112, the whole sidewall 104S of the frame 104, and a top surface 104T of the frame 104. Moreover, the encapsulation layer 1081 is in contact with a portion of the sidewall 104S of the frame 104 and a portion of the top surface 104T of the frame 104. In addition, the first protection layer 118 or the second protection layer 122 described above are not included in the light source 100 of this embodiment. However, in variant embodiments, the first protection layer 118 or the second protection layer 122 may be disposed in the light source 100.

Figure 11:
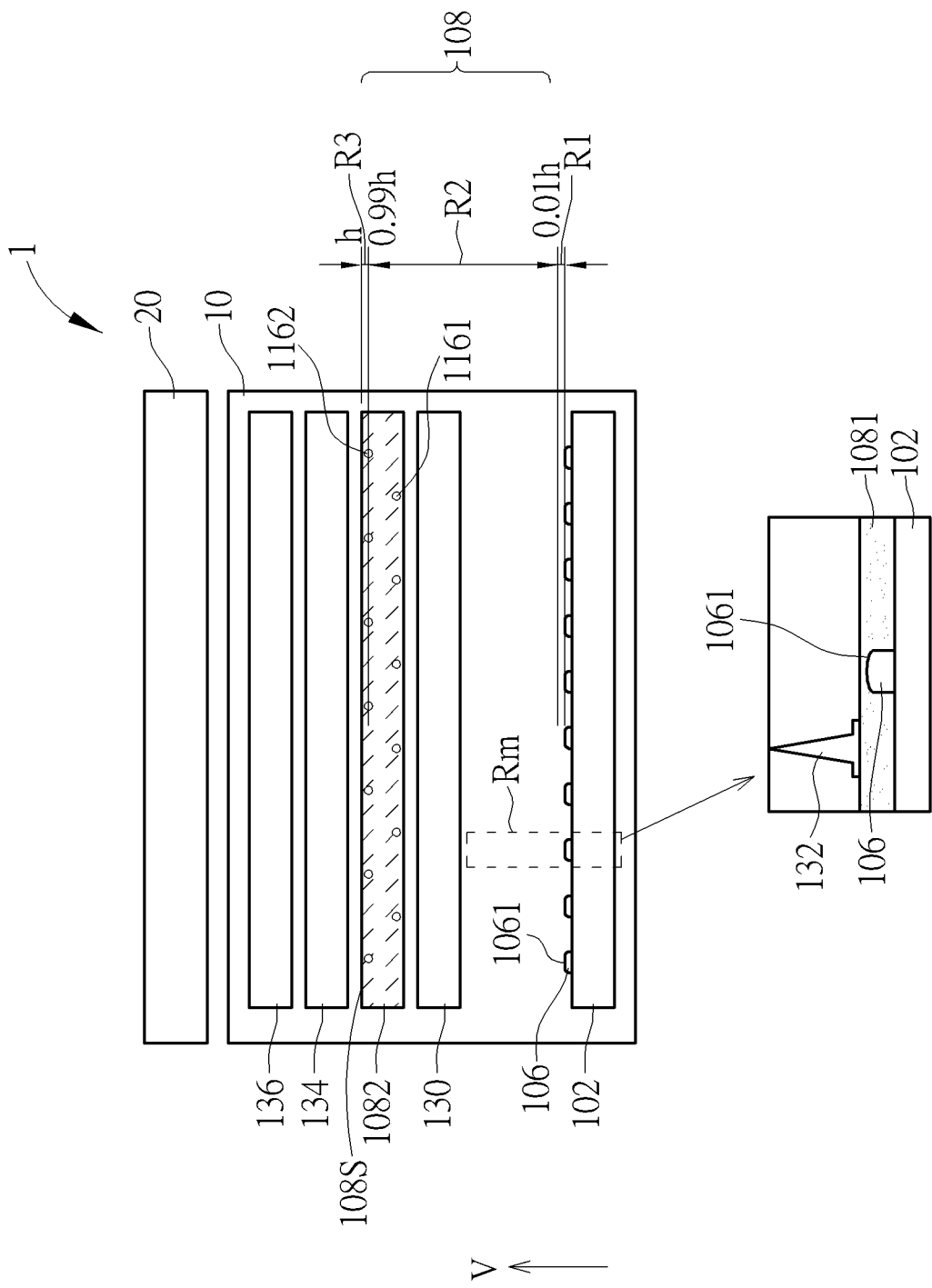
FIG. 11 is a cross-sectional schematic diagram of a display device according to a ninth embodiment of the present disclosure.

Referring to FIG. 11, it is a cross-sectional schematic diagram of a display device according to a ninth embodiment of the present disclosure. In FIG. 11, the display device 1 includes the backlight module 10 and the display panel 20 disposed thereon, which is similar to FIG. 1A. In this embodiment, the backlight module 10 may include multiple light emitting units 106 and a light converting layer 1082, and the backlight module 10 may further include a first diffusion film 130, a second diffusion film 134, and a prism film 136. The first diffusion film 130 may be disposed between the light converting layer 1082 and the encapsulation layer 1081 (shown in the enlargement of a region Rm), and therefore the light converting layer 1082 is spaced apart from the encapsulation layer 1081 in this embodiment. In the enlargement of the region Rm, at least one pin 132 may be disposed between the first diffusion film 130 and the base plate 102, more specifically, the pin 132 is disposed between the first diffusion film 130 and the encapsulation layer 1081. In some embodiments, the pin 132 may be disposed on the surface of the base plate 102 where the encapsulation layer 1081 is not formed thereon. In some embodiments, the peak of the pin 132 may contact the bottom of the first diffusion film 130. The distance h may be calculated from the first top surface 1061 to the second top surface 108S within a projection of the first top surface 1061 of the light emitting unit 106 along the direction V. Accordingly, the distance h of the light converting component 108 of this embodiment further includes the thickness of the first diffusion film 130 and the gap between the encapsulation layer 1081 and the first diffusion film 130. In some examples, the gap may be formed by other mechanical components. The pin 132 may be disposed by a side of the light emitting unit 106, and they may not overlap with each other. The amount or the location of the pin 132 may be adjusted according to different designs or requirements. In addition, the first light converting elements 1161 and the second light converting elements 1162 described in the above embodiments may also be disposed in the light converting layer 1082 in this embodiment.

The second diffusion film 134 may be disposed on the light converting layer 1082, and the light converting layer 1082 may be disposed between the first diffusion film 130 and the second diffusion film 134. The first diffusion film 130 and the second diffusion film 134 may adjust the light to be more uniformly distributed. In some embodiments, the backlight module 10 may not include the second diffusion film 134, but it is not limited thereto. The prism film 136 may be disposed on the second diffusion film 134, and the second diffusion film 134 may be disposed between the prism film 136 and the light converting layer 1082. The prism film 136 may enhance the brightness of the light emitted by the backlight module 10. In some embodiments, the encapsulation layer 1081 may not be a full layer but includes patterns, and the patterns may cover some of the light emitting units 106. In some examples, the backlight module 10 may include other optical films and/or may omit at least one of the optical films mentioned above (e.g. the second diffusion film 134), depending on the needs.

Figure 12:
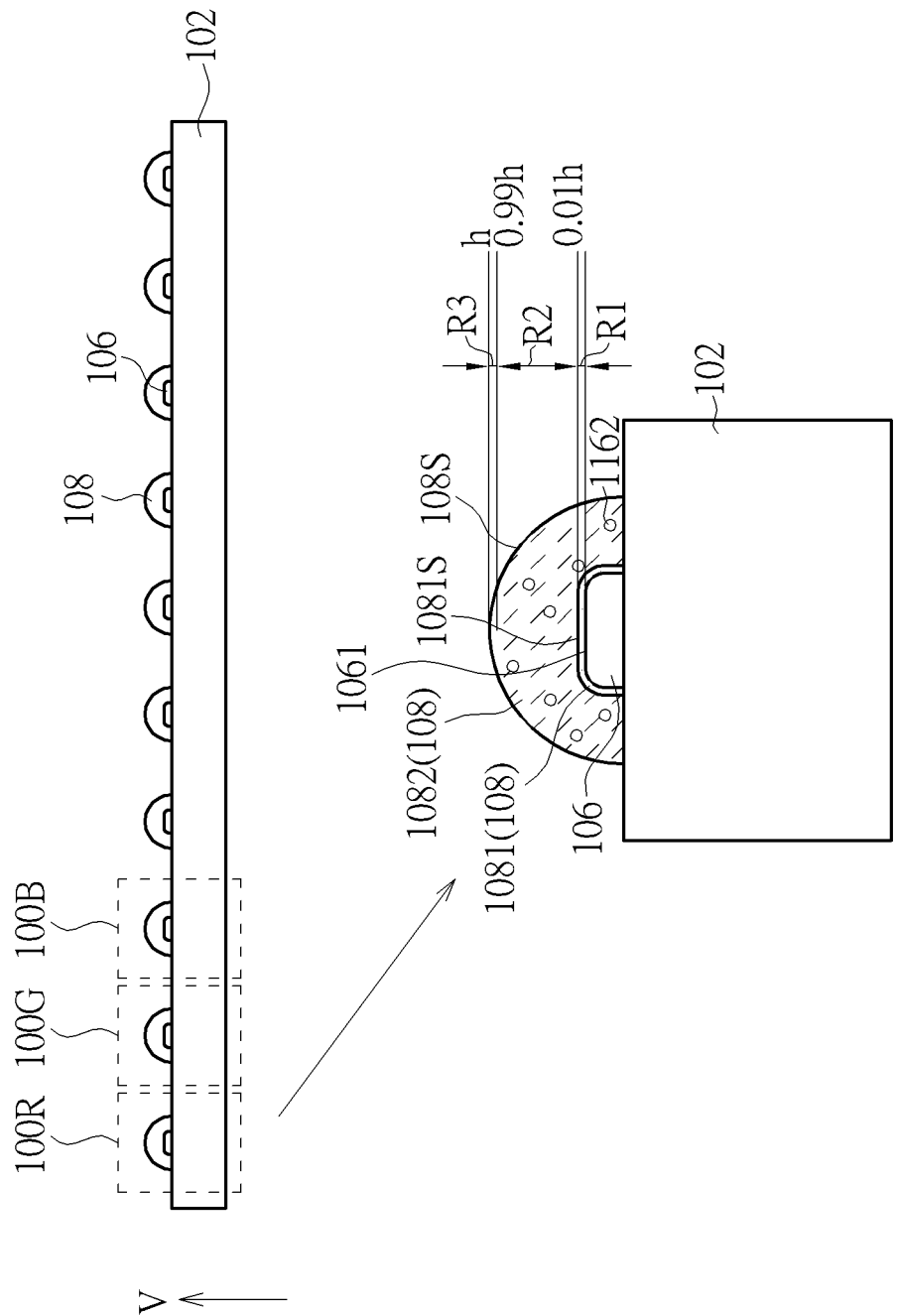
FIG. 12 is a cross-sectional schematic diagram of a display device according to a tenth embodiment of the present disclosure.

Referring to FIG. 12, it is a cross-sectional schematic diagram of a display device according to a tenth embodiment of the present disclosure. In this embodiment, a plurality of light sources 100R, a plurality light sources 100G, and a plurality of light sources 100B are provided. The light sources 100R, the light sources 100G, and the light sources 100B can be used for emitting lights having different colors or spectrums. The light sources 100R, the light sources 100G and the light sources 100B may have similar structures. For example, as shown in the enlargement of the light source 100R, a top surface (or the second top surface 108S) of the light converting layer 1082 may be a convex surface, and a top surface (or the top surface 1081S) of the encapsulation layer 1081 may be a flat surface. The distance h may be calculated from the first top surface 1061 to the second top surface 108S along the direction V. In addition, the thickness of the encapsulation layer 1081 may be less than the thickness of the light converting layer 1082.

In this embodiment, the light emitting units 106 may be micro LEDs, and the light converting elements disposed in the light converting layers 1082 of the light sources 100R and the light sources 100G may be different. For example, the light converting elements disposed in the light sources 100R may be used for converting blue light into red light, such as the second light converting elements 1162 described in the above embodiments, and the light converting elements disposed in the light sources 100G may be used for converting blue light into green light, such as the first light converting elements 1161 described in the above embodiments. In addition, the light source 100B may be used for emitting blue light, and the light converting layer 1082 of the light source 100B may include the light converting elements that can emit blue light, or the light converting layer 1082 of the light sources 100B may not include the light converting elements. In some examples, the light converting layer 1082 may include scattering particles, such as titanium oxide particles and/or zinc oxide particles.

Figure 13:
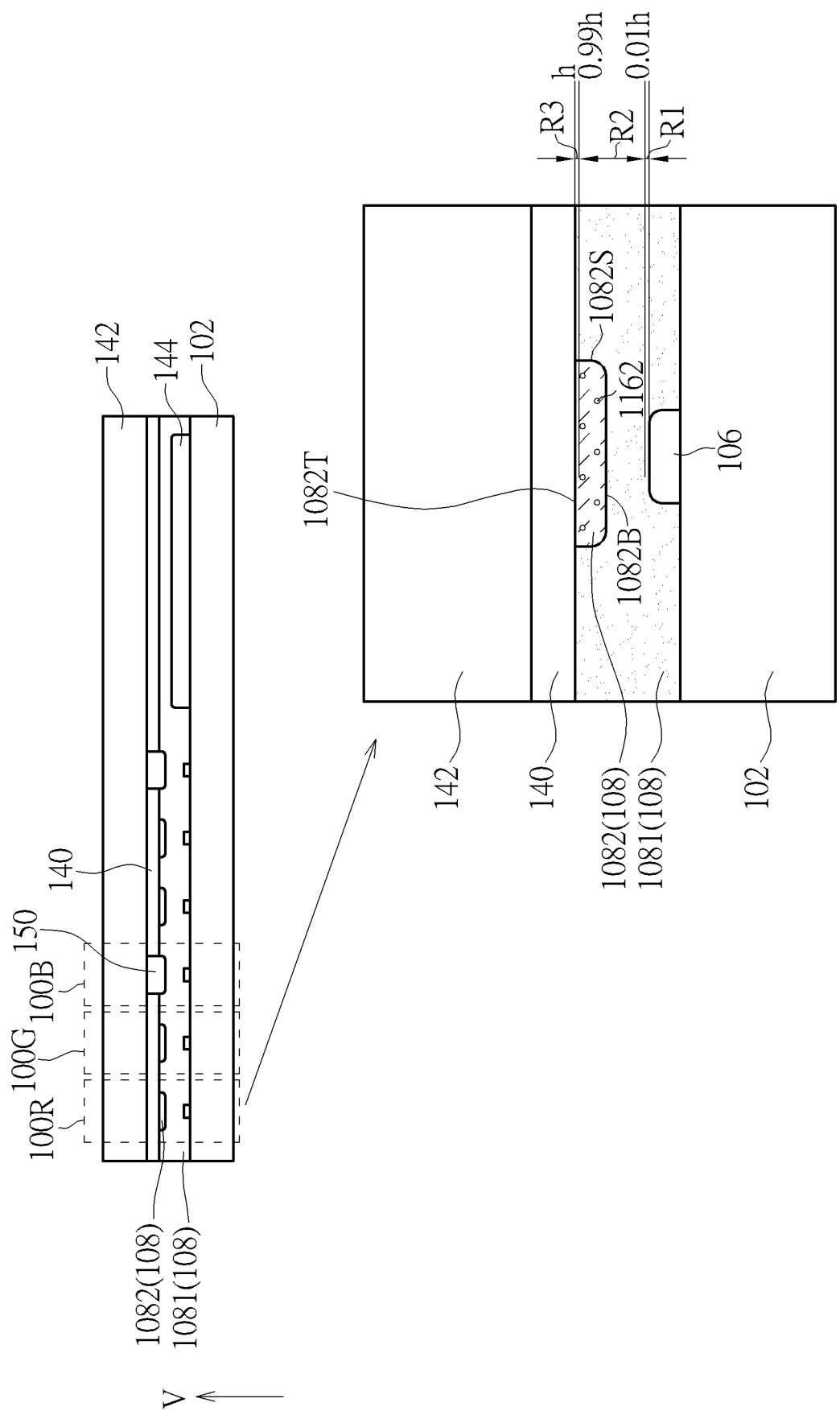
FIG. 13 is a cross-sectional schematic diagram of a display device according to an eleventh embodiment of the present disclosure.

Referring to FIG. 13, it is a cross-sectional schematic diagram of a display device according to an eleventh embodiment of the present disclosure. In this embodiment, a plurality of light sources 100R, a plurality light sources 100G, and a plurality of light sources 100B are provided. The light sources 100R, the light sources 100G, and the light sources 100B can be used for emitting lights having different colors or spectrums. The light sources 100R, the light sources 100G and the light sources 100B may have similar structures. For example, as shown in the enlargement of the light source 100R, the light converting layer 1082 includes a top surface 1082T (also referred to as the second top surface 108S in the above embodiments), a bottom surface 1082B, and a side surface 1082S. The bottom surface 1082B is disposed between the top surface 1082T and the light emitting unit 106. The encapsulation layer 1081 may cover the bottom surface 1082B and the side surface 1082S of the light converting layer 1082. Additionally, the light converting elements disposed in the light sources 100R may be used for converting blue light into red light, such as the second light converting elements 1162 described in the above embodiments, and the light converting elements disposed in the light sources 100G may be used for converting blue light into green light, such as the first light converting elements 1161 described in the above embodiments. In some examples, the light sources 100B may include optical elements 150 on the light emitting units 106. The material of the optical elements 150 may include air, scattering particles, light converting elements, or a combination thereof.

In addition, the light sources 100R and the light sources 100G can further include a blocking filter 140. For example, as shown in the enlargement of the light source 100R, the blocking filter 140 is disposed on the light converting layer 1082 and the encapsulation layer 1081, and the light converting layer 1082 is disposed between the blocking filter 140 and the light emitting unit 106. The blocking filter 140 may include materials that can block or absorb the residual blue light unconverted by the light converting layer 1082. But the present disclosure is not limited thereto. In other examples, the blocking filter 140 may include materials that can block or absorb light with other colors (e.g. red light or green light). The blocking filter 140 may not be disposed in the light sources 100B in this embodiment.

Additionally, the blocking filter 140 may be disposed on the integrated circuit (IC) 144. In this embodiment, the light emitting units 106 may be micro LEDs. At least one IC 144 may be disposed on the base plate 102, and the light emitting units 106 may be electrically connected to or controlled by the IC 144, but not limited thereto.

In this embodiment, the light sources 100R, the light sources 100G, and the light sources 100B may further include an insulating layer 142. The insulating layer 142 may be disposed on the blocking filter 140, and the blocking filter 140 is disposed between the insulating layer 142 and the light converting layer 1082. The material of the insulating layer 142 may include a transparent insulating material. Additionally, the insulating layer 142 may be disposed on the IC 144.

In addition, the encapsulation layer 1081 of this embodiment may include glue or waveguide layer. For example, the light emitting units 106 and the IC 144 may be formed on the base plate 102, and the light converting layer 1082, the blocking filter 140, and the insulating layer 142 may be formed on another substrate. The structures formed on the base plate 102 and this substrate may be adhered through the encapsulation layer 1081. In some examples, the blocking filter 140, the optical elements 150, and/or the light converting layer 1082 may be formed on the base plate 102, but it is not limited thereto.

Figure 14:
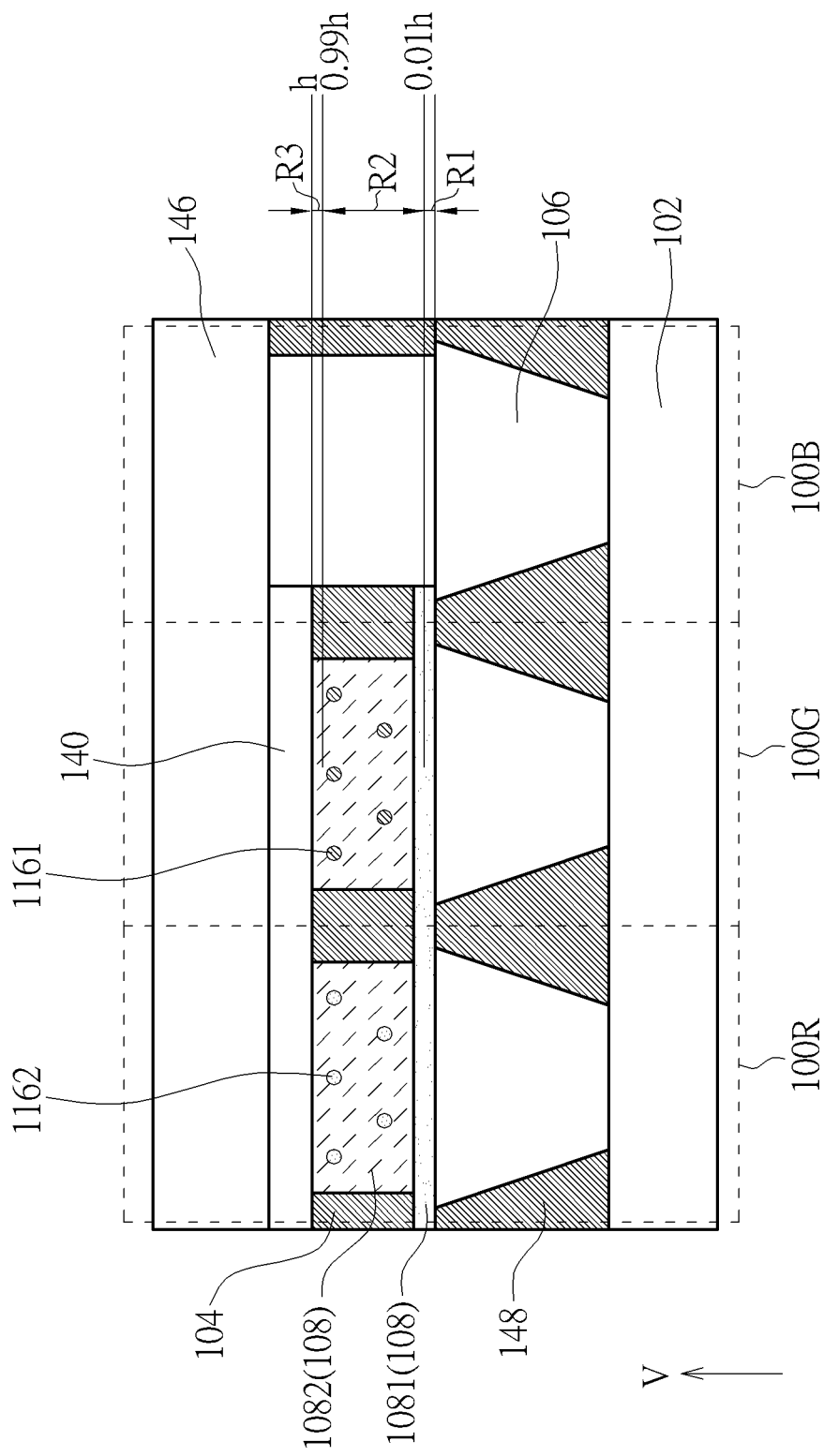
FIG. 14 is a cross-sectional schematic diagram of a display device according to a twelfth embodiment of the present disclosure.

Referring to FIG. 14, it is a cross-sectional schematic diagram of a display device according to a twelfth embodiment of the present disclosure. In this embodiment, the frame 104 may be used for isolating the light source 100R, the light source 100G, and the light source 100B. The frame 104 may be formed of the material that can block, absorb, or reflect light, but not limited thereto. As shown in FIG. 14, in the light source 100R and the light source 100G, the frame 104 is disposed on the encapsulation layer 1081 and adjacent to the light converting layers 1082. The light converting elements disposed in the light source 100R may be used for converting blue light into red light, such as the second light converting elements 1162 described in the above embodiments, and the light converting elements disposed in the light source 100G may be used for converting blue light into green light, such as the first light converting elements 1161 described in the above embodiments.

In addition, the light source 100R and the light source 100G may further include a blocking filter 140. For example, the blocking filter 140 is disposed on the light converting layers 1082 and the frame 104, and the light converting layers 1082 are disposed between the blocking filter 140 and the encapsulation layer 1081. The blocking filter 140 may include materials that can block or absorb the residual blue light unconverted by the light converting layer 1082, but the present disclosure is not limited thereto. In other examples, the blocking filter 140 may include materials that can block or absorb light with other colors (e.g. red light or green light). The blocking filter 140 may not be disposed in the light source 100B in this embodiment.

In this embodiment, the light emitting units 106 may be LEDs. The light emitting units 106 may be disposed in a supporting structure 148 on the base plate 102, and the light emitting units 106 may be isolated by the supporting structure 148. The material of the supporting structure 148 may include the insulating material, but not limited thereto. Similar to the eleventh embodiment, the light emitting units 106 may be electrically connected to the IC (not shown) disposed on the base plate 102.

In this embodiment, a substrate 146 may be disposed on the blocking filter 140, and the blocking filter 140 may be disposed between the substrate 146 and the light converting layers 1082. The material of the substrate 146 may include a transparent insulating material, but not limited thereto. For example, the light emitting units 106 may be formed on the base plate 102. The light converting layers 1082 and the blocking filter 140 may be formed on the substrate 146. The structures respectively formed on the base plate 102 and the substrate 146 may be adhered through the encapsulation layer 1081 (e.g. a glue layer, an inorganic layer, an organic layer, or an adhesive layer).

To summarize the above descriptions, in the light source of the display device or the lighting apparatus in the present disclosure, the light emitting unit is covered by the first region of the light converting component or surrounded by the sulfur-free encapsulation layer of the light converting component and not contact with the light converting layer that may include sulfur or zinc, so as to separate the light emitting unit from sulfur or zinc contained in the light converting elements in the light converting layer of the light converting component. Since the sulfur content in the first region or the encapsulation layer is very low or may even be zero, the reaction of the sulfur contained in the light converting elements and the metallic materials contained in the light emitting unit or the leads that are easily reacted with sulfur may be avoided. Therefore, the drawbacks brought by sulfidation (e.g., discoloration of silver or rise of resistivity of the light emitting unit or the leads) may be avoided effectively. The light converting component may also include zinc to improve conversion efficiency and light uniformity. Different types of light converting elements may be mixed together for simplifying the production. Also, different types of light converting elements may be arranged separately for better control of color gamut. In addition, the light source may include the first protection layer or the second protection layer, wherein the first protection layer may prevent the light emitting unit or the leads from reacting with sulfur in the environment, and the second protection layer may reduce the light converting component or the light emitting unit disposed therein being affected by oxygen or moisture in the environment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display device, comprising:
   a light source, comprising:
      a base plate;

a light emitting unit disposed on the base plate, the light emitting unit having a first top surface and a first bottom surface, and the first bottom surface being adjacent to the base plate and opposite to the first top surface; and a light converting component covering the light emitting unit, the light converting component having a second top surface, the first top surface being located between the second top surface and the base plate, and the light converting component comprising a light converting layer comprising a plurality of light converting elements, wherein a distance between the first top surface and the second top surface in a direction perpendicular to the base plate is defined as h, wherein, above the first top surface, a region of the light converting component from the first top surface to 0.01 h is defined as a first region with a first sulfur content, a region of the light converting component from the 0.01 h to 0.99 h is defined as a second region with a second sulfur content, and a region of the light converting component from the 0.99 h to the second top surface is defined as a third region with a third sulfur content, wherein the first sulfur content is less than the second sulfur content, and the first sulfur content is less than the third sulfur content, wherein the light converting component further comprises an encapsulation layer, the encapsulation layer is disposed between the light converting layer and the base plate, and the display device further comprises a first diffusion film disposed between the light converting layer and the encapsulation layer, wherein the display device further comprises at least one pin disposed between the first diffusion film and the base plate.

2. The display device of claim 1, wherein the second sulfur content is less than the third sulfur content.

3. The display device of claim 1, wherein the first sulfur content to the second sulfur content is defined as a first ratio, the first sulfur content to the third sulfur content is defined as a second ratio, the first ratio is greater than or equal to 0 and less than or equal to 0.75, and the second ratio is greater than or equal to 0 and less than or equal to 0.75.

4. The display device of claim 1, wherein the first region has a first zinc content, the second region has a second zinc content, the third region has a third zinc content, and the first zinc content is less than the second zinc content, and the first zinc content is less than the third zinc content.

5. The display device of claim 4, wherein the second zinc content is less than the third zinc content.

6. The display device of claim 1, wherein, the encapsulation layer covers the first top surface of the light emitting unit, the plurality of light converting elements is disposed in the light converting layer, and a sulfur content of the encapsulation layer is less than a sulfur content of the light converting layer.

7. The display device of claim 6, wherein a portion of a top surface of the encapsulation layer directly above the light emitting unit is a concave surface or a convex surface.

8. The display device of claim 6, wherein the light source further comprises a frame disposed on the base plate and around the light emitting unit, the encapsulation layer is in contact with a portion of a sidewall of the frame and a portion of a top surface of the frame, and the encapsulation layer comprises an inorganic material.

9. The display device of claim 6, wherein the light source further comprises a frame disposed on the base plate and around the light emitting unit, the encapsulation layer is in contact with a portion of a sidewall of the frame, the light converting layer is in contact with a rest portion of the sidewall of the frame, and the encapsulation layer comprises an organic material.

10. The display device of claim 1, wherein the plurality of light converting elements comprises a plurality of first light converting elements and a plurality of second light converting elements, the plurality of first light converting elements converts a light emitted from the light emitting unit into a first converted light with a first color, the plurality of second light converting elements converts the light emitted from the light emitting unit into a second converted light with a second color, and the first color is different from the second color.

11. The display device of claim 1, wherein the light source further comprises a first protection layer, and the first protection layer is disposed between the base plate and the light converting component.

12. The display device of claim 1, wherein the light source further comprises a second protection layer, and the light converting component is disposed between the second protection layer and the base plate.

13. The display device of claim 1, wherein the light source comprises a plurality of light emitting units, a plurality of light converting components and a frame, the frame is disposed on the base plate and comprises a plurality of cavities, wherein one of the light emitting units is covered by one of the light converting components and is disposed in one of the cavities.

14. The display device of claim 13, wherein the plurality of light converting elements in the light converting component in one of the cavities converts a light emitted from the light emitting unit into a converted light with a color.

15. The display device of claim 14, wherein the plurality of light converting elements in the light converting component in one of the cavities converts a light emitted from the light emitting unit into a converted light with a color different from a color of a converted light converted by the plurality of light converting elements in the light converting component in another one of the cavities.

16. The display device of claim 1, wherein the display device further comprises:

a second diffusion film disposed on the light converting layer, wherein the light converting layer is disposed between the first diffusion film and the second diffusion film; and a prism film disposed on the second diffusion film, wherein the second diffusion film is disposed between the prism film and the light converting layer.

17. The display device of claim 1, wherein the light converting component further comprises an encapsulation layer and a light converting layer, the encapsulation layer is disposed between the light converting layer and the base plate, and a top surface of the light converting layer is a convex surface.

18. The display device of claim 1, wherein the light converting component further comprises an encapsulation layer and a light converting layer, the encapsulation layer is disposed between the light converting layer and the base plate, the light converting layer comprises a top surface, a bottom surface, and a side surface, the bottom surface is disposed between the top surface and the light emitting unit, the encapsulation layer covers the bottom surface and the side surface of the light converting layer, and the light source further comprises:

a blocking filter disposed on the light converting layer and the encapsulation layer, wherein the light converting layer is disposed between the blocking filter and the light emitting unit.

19. The display device of claim 1, wherein the light converting component further comprises an encapsulation layer and a light converting layer, the encapsulation layer is disposed between the light converting layer and the base plate, and the light source further comprises:

a frame disposed on the encapsulation layer and adjacent to the light converting layer; and a blocking filter disposed on the light converting layer and the frame, wherein the light converting layer is disposed between the blocking filter and the encapsulation layer.

* * * * *